United States Patent
Kodama et al.

(10) Patent No.: US 10,528,028 B2
(45) Date of Patent: Jan. 7, 2020

(54) SUBSTRATE PROCESSING APPARATUS, SUBSTRATE PROCESSING METHOD AND MEMORY MEDIUM

(71) Applicant: TOKYO ELECTRON LIMITED, Minato-ku (JP)

(72) Inventors: Teruhiko Kodama, Koshi (JP); Masashi Enomoto, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 362 days.

(21) Appl. No.: 15/421,565

(22) Filed: Feb. 1, 2017

(65) Prior Publication Data

US 2017/0139399 A1 May 18, 2017

Related U.S. Application Data

(62) Division of application No. 14/632,544, filed on Feb. 26, 2015, now Pat. No. 9,601,394.

(30) Foreign Application Priority Data

| Mar. 5, 2014 | (JP) | ................................. 2014-042707 |
| Dec. 26, 2014 | (JP) | ................................. 2014-265759 |

(51) Int. Cl.
*G06F 19/00* (2018.01)
*G05B 19/406* (2006.01)
(Continued)

(52) U.S. Cl.
CPC ......... *G05B 19/406* (2013.01); *G05B 19/418* (2013.01); *G05B 23/0221* (2013.01);
(Continued)

(58) Field of Classification Search
CPC ............................................. G05B 2219/45031
(Continued)

(56) References Cited

U.S. PATENT DOCUMENTS

| 6,062,288 A * | 5/2000 | Tateyama .................. B08B 3/02 |
| | | 118/316 |
| 6,841,342 B2 * | 1/2005 | Nishi ........................ G03F 7/38 |
| | | 118/302 |

(Continued)

FOREIGN PATENT DOCUMENTS

| EP | 3267258 A1 * | 1/2018 | ......... G03F 7/70641 |
| JP | 02165996 A * | 6/1990 | |
| JP | 10-199947 A | 7/1998 | |

*Primary Examiner* — Suresh Suryawanshi
(74) *Attorney, Agent, or Firm* — Oblon, McClelland, Maier & Neustadt, L.L.P.

(57) ABSTRACT

A substrate processing system includes a film-forming device to form photosensitive film on substrate, an exposure device to expose the film on the substrate, a relay device to transfer the substrate between the film-forming and exposure devices, a warping data acquisition device to acquire measured warping data of the substrate, a communication device to perform data communication with the exposure device, and a control device including film-forming, relay, measuring, and communication control sub-devices. The film-forming sub-device controls the film-forming device to form the film on the substrate, the relay sub-device controls the relay device to transfer the substrate to the exposure device, the measuring sub-device controls the warping data acquisition device to acquire the data after the controlling by the film-forming sub-device prior to the controlling by the relay sub-device, and the communication sub-device controls the communication device to transmit the data to the exposure device.

20 Claims, 21 Drawing Sheets

(51) Int. Cl.
  *H01L 21/66* (2006.01)
  *G05B 19/418* (2006.01)
  *H01L 21/302* (2006.01)
  *H01L 21/67* (2006.01)
  *G05B 23/02* (2006.01)
  *H01L 21/677* (2006.01)

(52) U.S. Cl.
  CPC ...... *H01L 21/302* (2013.01); *H01L 21/67173* (2013.01); *H01L 21/67225* (2013.01); *H01L 21/67288* (2013.01); *H01L 21/67706* (2013.01); *H01L 22/12* (2013.01); *H01L 22/20* (2013.01); *G05B 2219/25242* (2013.01); *G05B 2219/45031* (2013.01)

(58) Field of Classification Search
  USPC .......................................................... 700/121
  See application file for complete search history.

(56) References Cited

U.S. PATENT DOCUMENTS

| | | | | |
|---|---|---|---|---|
| 8,027,020 B2* | 9/2011 | Nagasaka | ............ | G03F 7/70208 355/53 |
| 8,040,488 B2* | 10/2011 | Yasuda | ............... | G03F 7/70991 355/27 |
| 8,221,963 B2* | 7/2012 | Amako | ................ | G02B 5/1857 359/570 |
| 8,288,174 B1* | 10/2012 | Rathsack | .......... | H01L 21/67253 257/48 |
| 8,635,968 B2* | 1/2014 | Kaneyama | .............. | G03B 27/58 118/500 |
| 8,941,809 B2* | 1/2015 | Kanaoka | ........... | H01L 21/67288 355/30 |
| 9,703,199 B2* | 7/2017 | Asano | ................ | H01L 21/67028 |
| 2005/0186691 A1 | 8/2005 | Koike | | |
| 2006/0079027 A1 | 4/2006 | Yamada | | |
| 2008/0226830 A1* | 9/2008 | Miyagi | ................... | G03F 7/168 427/402 |
| 2009/0059217 A1* | 3/2009 | Okita | ................. | G01N 21/9501 356/237.5 |
| 2010/0097588 A1* | 4/2010 | Phillips | .................. | G03B 27/32 355/53 |
| 2011/0233771 A1* | 9/2011 | Kwon | ...................... | H01L 22/20 257/737 |
| 2012/0215338 A1* | 8/2012 | Inoue | .................. | H01L 51/0096 700/108 |
| 2013/0258299 A1* | 10/2013 | Nishimura | ............ | G03F 7/2012 355/27 |
| 2014/0065309 A1* | 3/2014 | Kashiyama | ............... | G03F 7/16 427/331 |
| 2014/0145324 A1* | 5/2014 | Uchibori | ................. | H01L 23/48 257/737 |
| 2014/0202383 A1 | 7/2014 | Cheng | | |
| 2014/0287538 A1* | 9/2014 | Inoue | ................. | H01L 21/67288 438/4 |

* cited by examiner

FIG. 12(a)
FIG. 12(b)
FIG. 12(c)
FIG. 12(d)
FIG. 12(e)
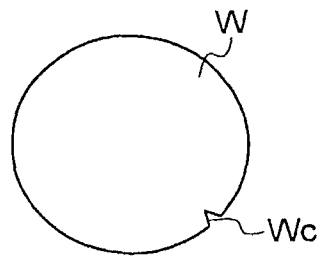
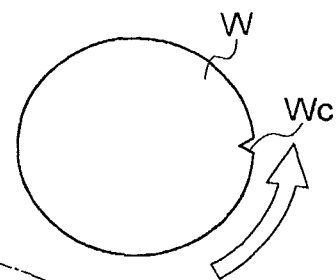
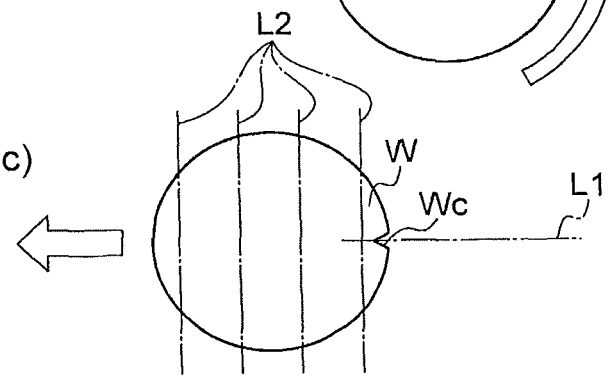
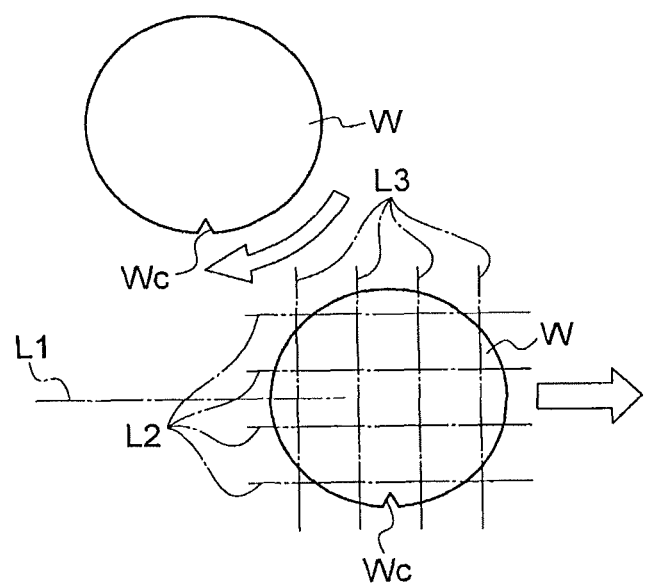

SUBSTRATE PROCESSING APPARATUS, SUBSTRATE PROCESSING METHOD AND MEMORY MEDIUM

CROSS-REFERENCE TO RELATED APPLICATIONS

The present application is a divisional of and claims the benefit of priority to U.S. application Ser. No. 14/632,544, filed Feb. 26, 2015, which is based upon and claims the benefit of priority to Japanese Patent Application No. 2014-042707, filed Mar. 5, 2014, and No. 2014-265759, filed Dec. 26, 2014. The entire contents of these applications are incorporated herein by reference.

BACKGROUND OF THE INVENTION

Field of the Invention

The present invention relates to a substrate processing apparatus, a substrate processing method and a memory medium.

Description of Background Art

JP H10-199947A describes a method for measuring the degree of warping of a wafer by using the automatic focusing mechanism of a stepper exposure system. The entire contents of this publication are incorporated herein by reference.

SUMMARY OF THE INVENTION

According to one aspect of the present invention, a substrate processing system includes a film-forming device which forms a photosensitive film on a front surface of a substrate, an exposure device which exposes the photosensitive film formed on the substrate, a relay device which is positioned between the film-forming device and the exposure device and transfers the substrate between the film-forming device and the exposure device, a warping data acquisition device which acquires measured warping data of the substrate, a communication device which performs data communication with the exposure device, and a control device including a film-forming control sub-device, a relay control sub-device, a measuring control sub-device, and a communication control sub-device. The film-forming control sub-device controls the film-forming device such that the film-forming device forms the photosensitive film on the front surface of the substrate, the relay control sub-device controls the relay device such that the relay device transfers the substrate having the photosensitive film to the exposure device, the measuring control sub-device controls the warping data acquisition device such that the warping data acquisition device acquires the measured warping data after the controlling by the film-forming control sub-device prior to the controlling by the relay control sub-device, and the communication control sub-device controls the communication device such that the communication device transmits the measured warping data to the exposure device.

According to another aspect of the present invention, a substrate processing system includes a film-forming device which forms a photosensitive film on a front surface of a substrate, an exposure device which exposes the photosensitive film formed on the substrate, a relay device which is positioned between the film-forming device and the exposure device and transfers the substrate between the film-forming device and the exposure device, a warping data acquisition device which acquires measured warping data of the substrate, a roughening process device which applies roughening process on a back surface of the substrate, and a control device including a film-forming control sub-device, a relay control sub-device, a measuring control sub-device, and a process control sub-device. The film-forming control sub-device controls the film-forming device such that the film-forming device forms the photosensitive film on the front surface of the substrate, the relay control sub-device controls the relay device such that the relay device transfers the substrate having the photosensitive film to the exposure device, the measuring control sub-device controls the warping data acquisition device such that the warping data acquisition device acquires the measured warping data after the controlling by the film-forming control sub-device prior to the controlling by the relay control sub-device, and the process control sub-device controls the roughening process device such that the roughening process device applies the roughening process on the back surface of the substrate based on the measured warping data after the controlling by the measuring control sub-device prior to the controlling by the relay control sub-device.

According to yet another aspect of the present invention, a method for processing a substrate includes forming a photosensitive film on a front surface of a substrate, acquiring measured warping data of the substrate having the photosensitive film formed thereon, transferring the substrate having the photosensitive film to an exposure device after acquisition of the measured warping data, and transmitting the measured warping data to the exposure device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 12(a)-12(e) show views schematically illustrating procedures for measuring a distance;

DETAILED DESCRIPTION OF THE EMBODIMENTS

Figure 1:
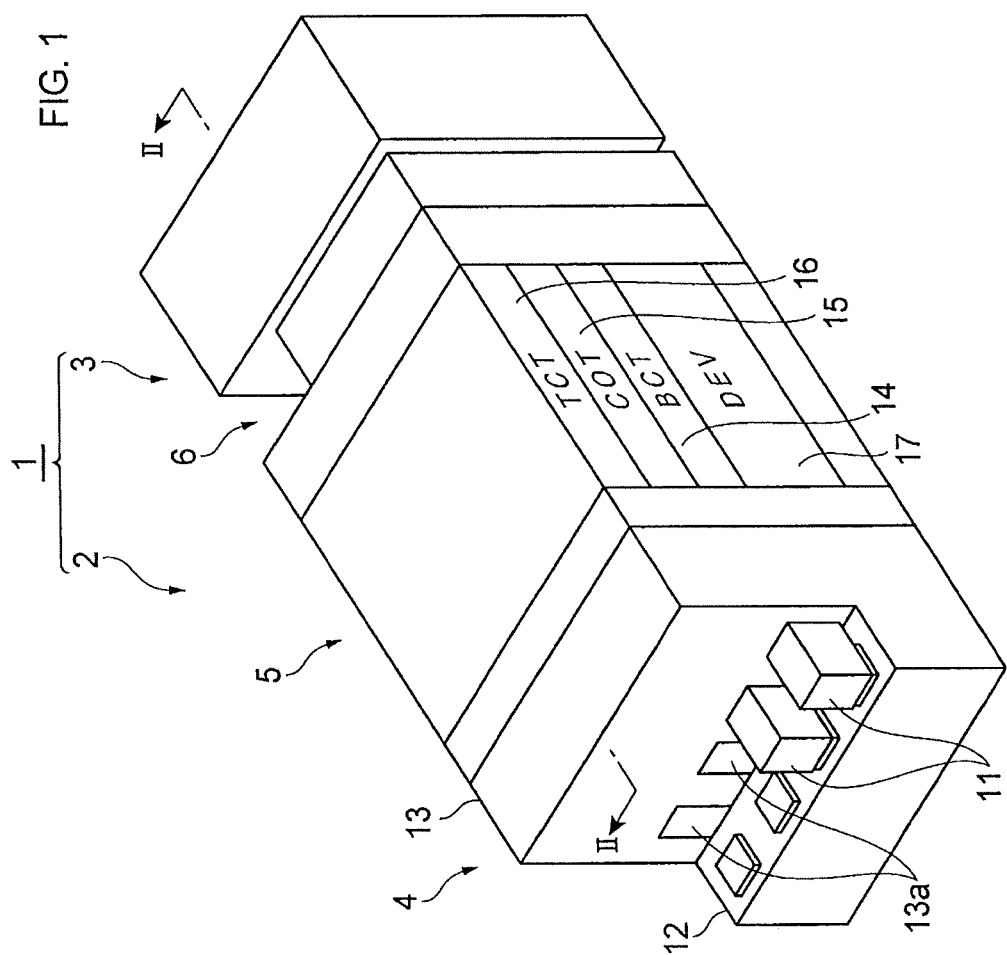
FIG. 1 shows a perspective view of a substrate processing system according to an embodiment of the present invention.
Figure 2:
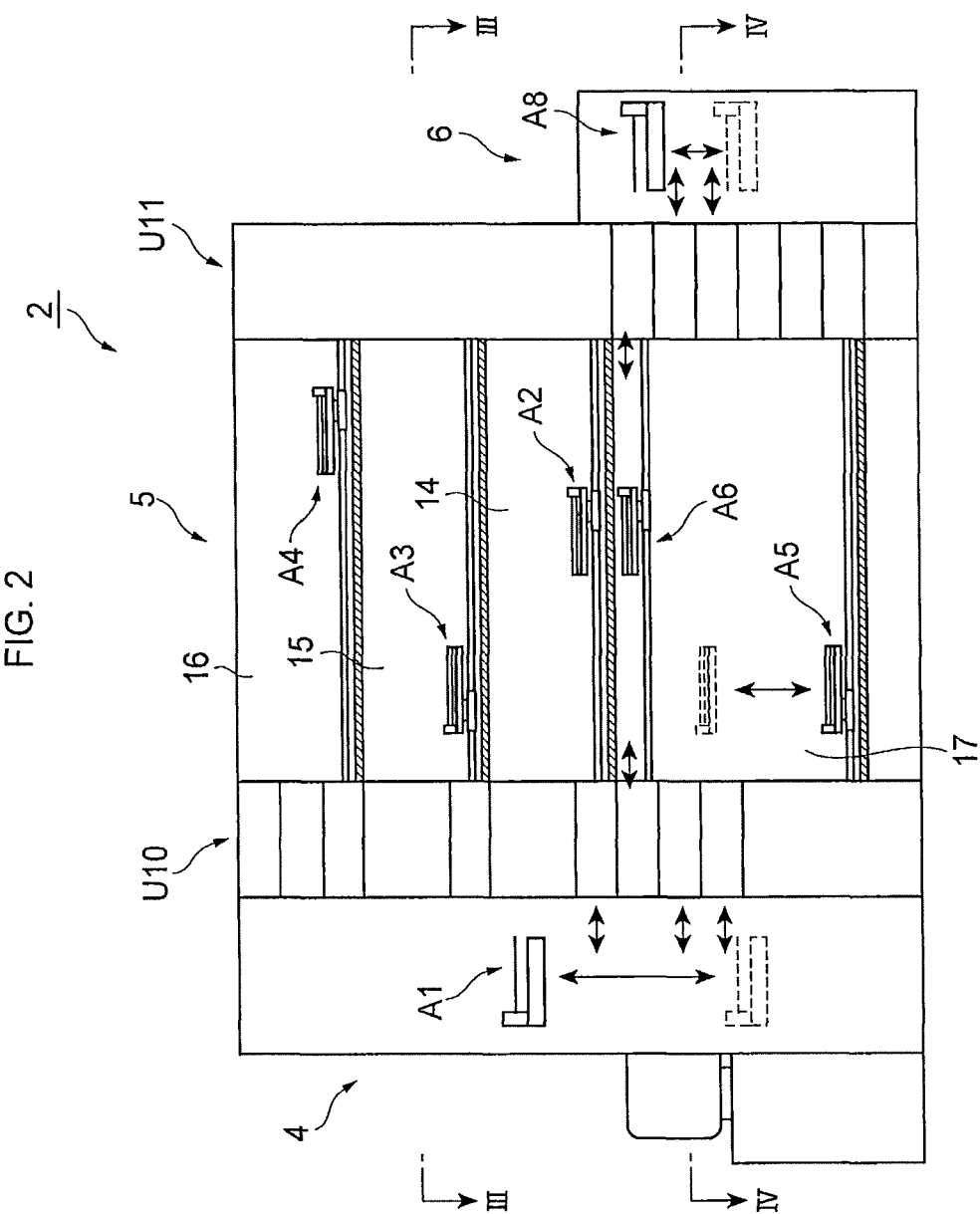
FIG. 2 shows a cross-sectional view taken at the (II-II) line in FIG. 1.

The embodiments will now be described with reference to the accompanying drawings, wherein like reference numerals designate corresponding or identical elements throughout the various drawings.

First Embodiment

Substrate Processing System

Substrate processing system 1 according to a first embodiment is provided with coating/development apparatus 2 and exposure device 3. Exposure device 3 performs exposure treatment on a resist film (photosensitive film). More specifically, using an immersion exposure method or the like, energy beams are irradiated on a portion of the resist film to be exposed. Examples of energy beams are ArF excimer laser, KrF excimer laser, g-line, i-line and extreme ultraviolet (EUV).

Coating/development apparatus 2 (substrate processing apparatus) performs a resist film forming process on the front surface of a wafer (W) (substrate) prior to exposure treatment by exposure device 3, and performs a resist film developing treatment after the exposure treatment. As shown in FIGS. 1~4, coating/development apparatus 2 is provided with carrier block 4, processing block 5, interface block 6, control device 100, and communication device 200. Carrier block 4, processing block 5 and interface block 6 are arrayed horizontally.

Carrier block 4 has carrier station 12 and loading/unloading device 13. Loading/unloading device 13 is disposed between carrier station 12 and processing block 5.

Carrier station 12 supports multiple carriers 11. Carrier 11 hermetically accommodates multiple wafers (W), and is provided with a door (not shown) for loading/unloading a wafer (W) on the side surface (11a) side. Carrier 11 is placed on carrier station 12 to be detachable from the carrier station in such a way that side surface (11a) faces loading/unloading device 13.

Loading/unloading device 13 has multiple doors (13a) respectively corresponding to multiple carriers 11 on carrier station 12. By opening the door on side surface (11a) and door (13a) simultaneously, the inner side of carrier 11 and the inner side of loading/unloading device 13 are connected. Loading/unloading device 13 accommodates delivery arm (A1), which unloads a wafer (W) from carrier 11 to deliver it to processing block 5, and receives a wafer (W) from processing block 5 to return it to carrier 11.

Processing block 5 includes bottom-layer film forming (BCT) module 14, resist film forming (COT) module 15, top-layer film forming (TCT) module 16 and development (DEV) module 17. Those modules are stacked in the order of DEV module 17, BCT module 14, COT module 15 and TCT module 16 from the floor side.

BCT module 14 accommodates multiple coating units (not shown), multiple thermal treatment units (not shown), and a transfer arm (A2) to transfer a wafer (W) to those units, and forms a bottom-layer film on the front surface of a wafer (W). A coating unit coats a wafer (W) with a chemical solution for forming a bottom-layer film. A thermal treatment unit applies heat to the wafer (W) by using a hot plate, for example, and cools the wafer (W) by using a cooling plate, for example. One specific example of a thermal treatment conducted in BCT module 14 is a thermal treatment for curing the chemical solution.

Figure 3:
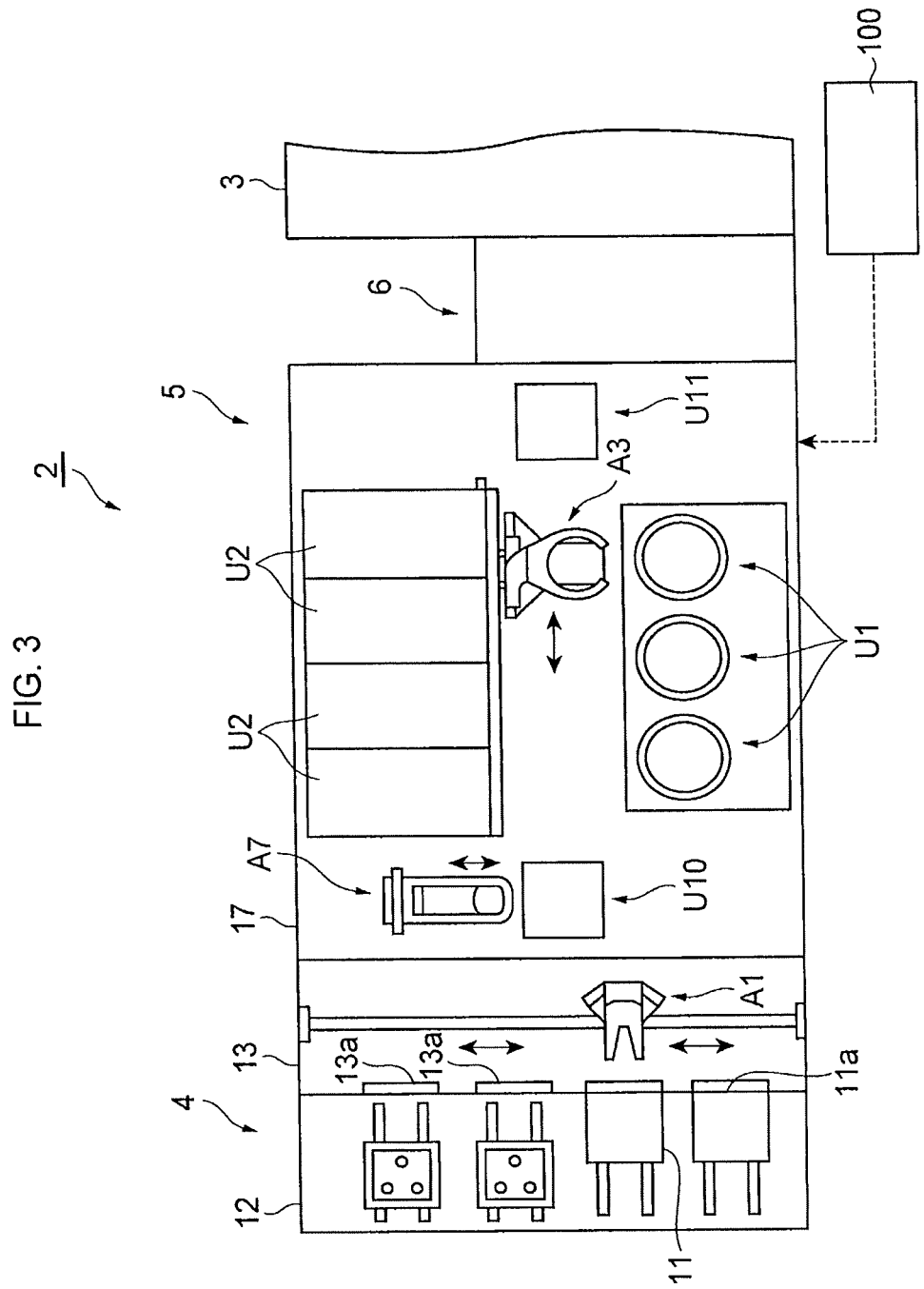
FIG. 3 shows a cross-sectional view taken at the (III-III) line in FIG. 2.

As shown in FIG. 3, COT module 15 accommodates multiple coating units (U1), multiple thermal treatment units (U2) and a transfer arm (A3) to transfer a wafer (W) to those units, and forms a resist film on the bottom-layer film. Namely, COT module 15 works as a film-forming device to form a photosensitive film. Coating unit (U1) coats a chemical solution for forming a resist film on a bottom-layer film. Thermal treatment unit (U2) applies heat to a wafer (W) by using a hot plate, for example, and cools the wafer (W) by using a cooling plate, for example. More specifically, pre-applied bake (PAB) is conducted for curing the chemical solution in COT module 15, for example.

TCT module 16 accommodates multiple coating units (not shown) and multiple thermal treatment units (not shown) and a transfer arm (A4) to transfer a wafer (W) to those units, and forms a top-layer film on the resist film. A coating unit coats the front surface of a wafer (W) with a chemical solution for forming a top-layer film. A thermal treatment unit applies heat to a wafer (W) by using a hot plate, for example, and cools the wafer (W) by using a cooling plate, for example. More specifically, TCT module 16 conducts, for example, a thermal treatment for curing the chemical solution.

Figure 4:
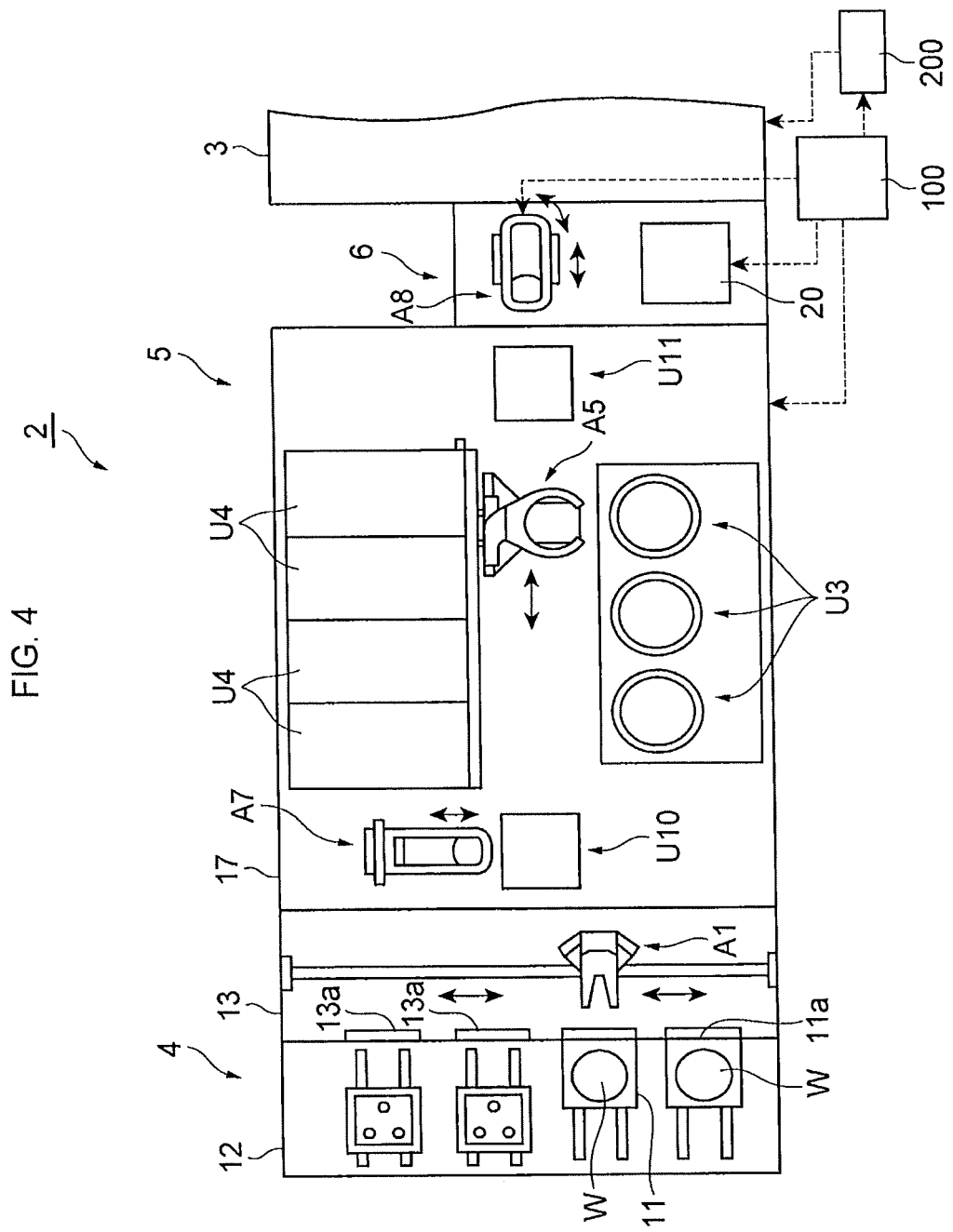
FIG. 4 shows a cross-sectional view taken at the (IV-IV) line in FIG. 3.

As shown in FIG. 4, DEV module 17 accommodates multiple development units (U3), multiple thermal treatment units (U4), a transfer arm (A5) to transfer a wafer (W) to those units, and a direct-transfer arm (A6) to transfer a wafer (W) without detouring to those units. Development unit (U3) develops the exposed resist film. Thermal treatment unit (U4) applies heat to a wafer (W) by using a hot plate, for example, and cools the wafer (W) by using a cooling plate, for example. More specifically, thermal treatment before developing treatment (PEB: post-exposure bake), thermal treatment after developing treatment (PB: post bake) and the like are conducted in DEV module 17.

On the carrier block 4 side of processing block 5, shelf unit (U10) is provided. Shelf unit (U10) is formed to extend from the floor surface to TCT module 16, and is divided into multiple cells which are arranged in a vertical direction. Elevator arm (A7) is provided near shelf unit (U10). Elevator arm (A7) lifts/lowers a wafer (W) among cells in shelf unit (U10). On the interface block 6 side of processing block 5, shelf unit (U11) is provided. Shelf unit (U11) is formed to extend from the floor surface to the upper portion of DEV module 17 and is divided into multiple cells which are arranged in a vertical direction.

Interface block 6 accommodates a delivery arm (A8) and back-surface inspection (BSI) unit 20, and is connected to exposure device 3. Delivery arm (A8) transfers a wafer (W) from shelf unit (U11) to BSI unit 20, delivers the wafer (W) to exposure device 3, and receives a wafer (W) from exposure device 3 to return it to shelf unit (U11). Interface block 6 corresponds to a relay device disposed between COT module 15 (film-forming device) and exposure device 3.

Figure 5:
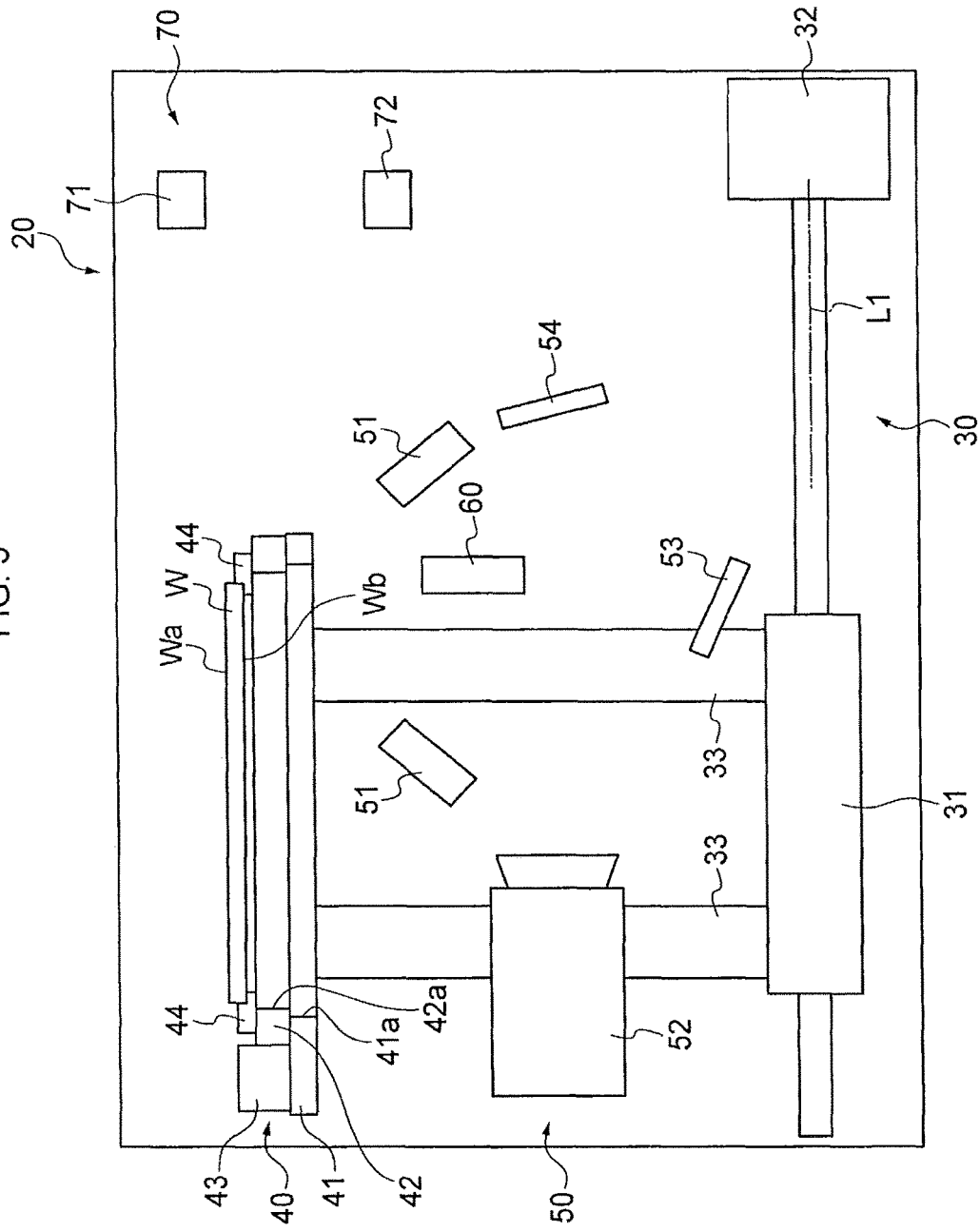
FIG. 5 is a view schematically showing a BSI unit.

BSI unit 20 works as a warping data acquisition device to acquire measured warping data of a wafer (W). As shown in FIG. 5, BSI unit 20 has transfer device 30, holding device 40, back-surface inspection device 50, measuring device 60 and base point detection device 70.

Transfer device 30 includes sliding table 31 and actuator 32. Actuator 32 has a built-in power source such as an electric motor, and moves sliding table 31 along a horizontal straight axis (L1).

Holding device 40 is fixed on sliding table 31 with multiple posts 33 disposed in between, and is used to hold the periphery of a wafer (W). Holding device 40 includes support plate 41, turntable 42 and actuator 43. Support plate 41 is positioned horizontally and is fixed on multiple posts 33. In the region of support plate 41 surrounded by multiple posts 33, opening (41a) is formed. The inner diameter of opening (41a) is set greater than the outer diameter of a wafer (W).

Turntable 42 is horizontally positioned on support plate 41, and has opening (42a) corresponding to opening (41a). The inner diameter of opening (42a) is set greater than the outer diameter of a wafer (W). Turntable 42 is set to be rotatable around the center axis of openings (41a, 42a). Actuator 43 has a built-in power source such as an electric motor or the like to rotate turntable 42.

Multiple (six, for example) holding hooks 44 are formed on the periphery of opening (42a). Multiple holding hooks 44 are positioned to surround opening (42a), and each protrudes toward the center of opening (42a). A wafer (W) is positioned on opening (42a) with its front surface (Wa) facing upward. Multiple holding hooks 44 support the periphery of the wafer (W) positioned on opening (42a). The periphery of a wafer (W) indicates, for example, a circumferential portion that is within 3 mm of the periphery. Holding device 40 supports a wafer (W) using holding hooks 44, but does not constrain the wafer (W) on holding hooks 44.

Back-surface inspection device 50 is positioned under holding device 40, and is used to detect contaminants attached to the back surface of a wafer (W). Back-surface inspection device 50 detects contaminants by using images, and has lighting source 51, imaging device 52 and multiple mirrors (53, 54).

Lighting source 51 irradiates back surface (Wb) of a wafer (W) held by holding device 40. Mirrors (53, 54) direct the image of back surface (Wb) to imaging device 52. Imaging device 52 acquires the image directed by mirrors (53, 54). Lighting source 51, imaging device 52 and mirrors (53, 54) are fixed to positions that do not interfere with sliding table 31, posts 33 and holding device 40. Thus, as transfer device 30 moves a wafer (W), an image taken by imaging device 52 of back-surface inspection device 50 changes accordingly.

Measuring device 60 is used to measure warping of a wafer (W) held by holding device 40. More specifically, measuring device 60 is positioned under a wafer (W) (on the back-surface side) held by holding device 40, and measures the distance to back surface (Wb). Measuring device 60 is fixed in a position that does not interfere with sliding table 31, posts 33 and holding device 40. Thus, as transfer device 30 moves a wafer (W), portions measured by measuring device 60 change accordingly.

Figure 11:
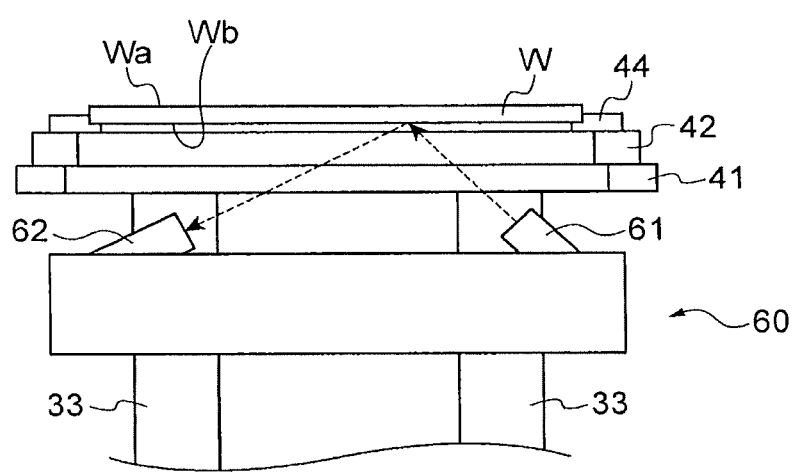
FIG. 11 shows a cross-sectional view taken at the (XI-XI) line in FIG. 10.
Figure 13A:
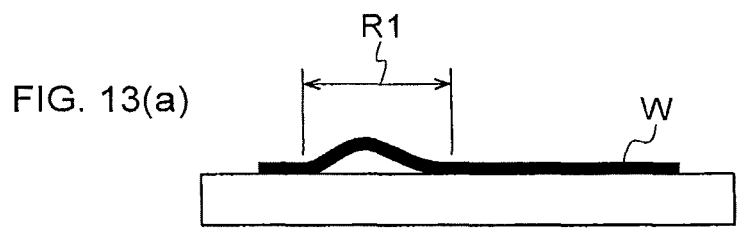
FIGS. 13(a)-13(f) show views schematically illustrating procedures for adsorbing a wafer.
Figure 13B:
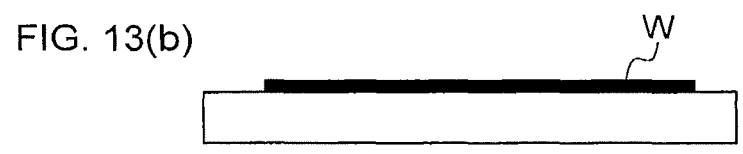
Figure 13C:
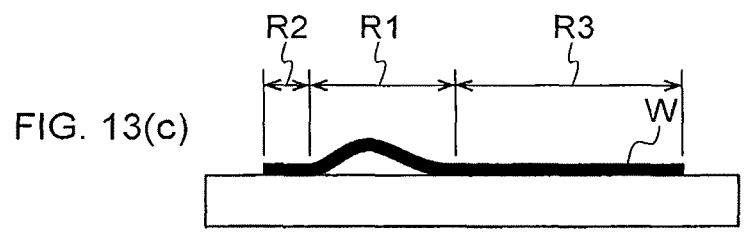
Figure 13D:
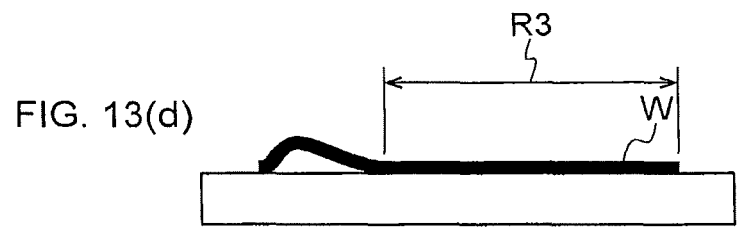
Figure 13E:
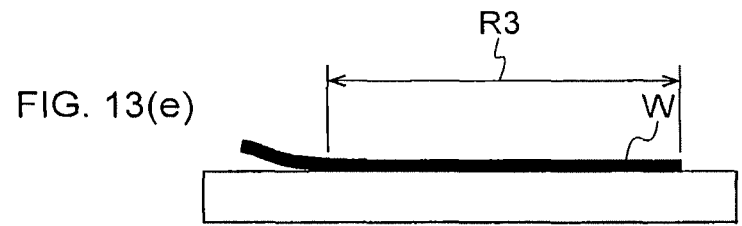
Figure 13F:
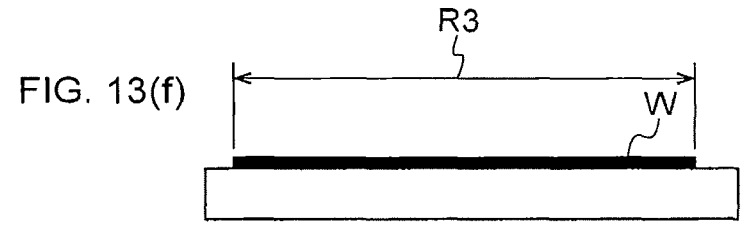

Measuring device 60 is a laser displacement gauge to measure the distance to back surface (Wb) by using laser light, for example, and has laser light source 61 and light receiver 62 (see FIG. 11). Laser light source 61 and light receiver 62 are horizontally arranged side by side. The direction in which light source 61 and light receiver 62 are arrayed intersects with (at a right angle, for example) the direction in which a wafer (W) is transferred by transfer device 30.

Laser light source 61 irradiates laser light onto back surface (Wb) of a wafer (W). Light receiver 62 obtains the light reflected at the irradiated spot of the back surface. By a triangulation method using the light emitting direction of laser light from laser light source 61 to back surface (Wb) and the light incidence direction from the irradiated spot to light receiver 62, measuring device 60 measures the distance to the irradiated spot. Measuring device 60 moves laser irradiation spots along a direction to face the direction in which laser light source 61 and light receiver 62 are arrayed (the direction perpendicular to a direction in which a wafer (W) is transferred by transfer device 30), and measures the distance to the irradiated spots.

BSI unit 20 acquires the measured values obtained by measuring device 60. The measured values include the self-weight factor of a wafer (W). Thus, BSI unit 20 conducts calculations to remove the self-weight factor of a wafer (W) from the measured values obtained by measuring device 60. As a result of such calculations, BSI unit 20 obtains measured warping data.

Base point detection device 70 is used to detect the alignment base of a wafer (W). More specifically, base point detection device 70 detects a notch (Wc) formed on the periphery of a wafer (W) as an alignment base. Base point detection device 70 has light source 71 and light receiver 72, and detects a notch (Wc) by determining whether the emitted light from light source 71 reaches light receiver 72.

Communication device 200 is used to perform data communication with exposure device 3.

Control device 100 is structured with one or multiple computers and is used to control coating/development apparatus 2. Control device 100 has a display section (not shown) to display a screen for setting the conditions of each treatment, an input section (not shown) for inputting conditions for each treatment, and a readout section (not shown) for reading a program from a computer readable memory medium. The memory medium stores programs for coating/development apparatus 2 to execute a substrate processing method. Those programs are read by the readout section of control device 100. Examples of a memory medium are a hard disk, a compact disc, flash memory, a flexible disk, a memory card and the like. Control device 100 controls coating/development apparatus 2 according to the conditions inputted into the input section and the program read by the readout section.

Figure 6:
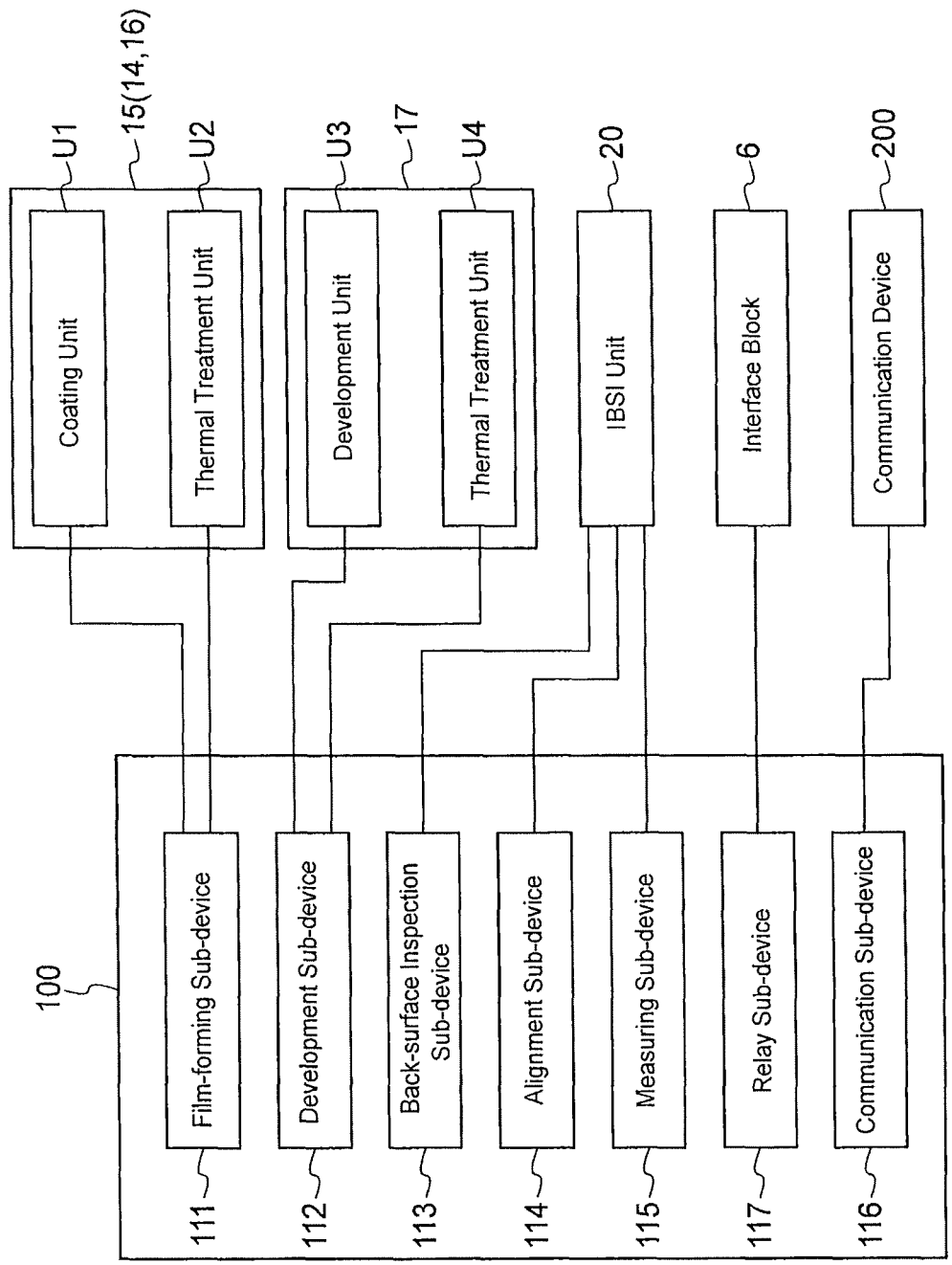
FIG. 6 is a diagram showing the functional structure of a control device.

FIG. 6 is a diagram showing individual functions as virtual elements to be achieved when programs are executed (hereinafter referred to as "functional blocks"). As shown in FIG. 6, control device 100 has film-forming control sub-device 111, development control sub-device 112, back-surface inspection control sub-device 113, alignment control sub-device 114, measuring control sub-device 115, communication control sub-device 116 and relay control sub-device 117 as functional blocks.

Film-forming control sub-device 111 controls BCT module 14 to form a bottom-layer film on front surface (Wa) of a wafer (W), controls COT module 15 to form a resist film on the bottom-layer film, and controls TCT module 16 to form a top-layer film on the resist film.

Development control sub-device 112 controls DEV module 17 to perform developing treatment on the resist film after the exposure treatment.

After the process controlled by film-forming control sub-device 111 but before the process controlled by measuring control sub-device 115, back-surface inspection control sub-device 113 controls BSI unit 20 so that back-surface inspection device 50 inspects to see if there are contaminants attached to back surface (Wb) of a wafer (W).

Alignment control sub-device 114 controls BSI unit 20 before the process controlled by measuring control sub-device 115 so that notch (Wc) of a wafer (W) is detected by base point detection device 70 and the wafer (W) is aligned.

After the process controlled by film-forming control sub-device 111 but before the process controlled by relay control sub-device 117, measuring control sub-device 115 controls BSI unit 20 to acquire the measured warping data.

Communication control sub-device 116 controls communication device 200 to transmit the measured data acquired by BSI unit 20 to exposure device 3.

Relay control sub-device 117 controls interface block 6 so that a wafer (W) is transferred by delivery arm (A8) to exposure device 3, and a wafer (W) is received by delivery arm (A8) from exposure device 3.

Substrate Processing Method

Figure 7:
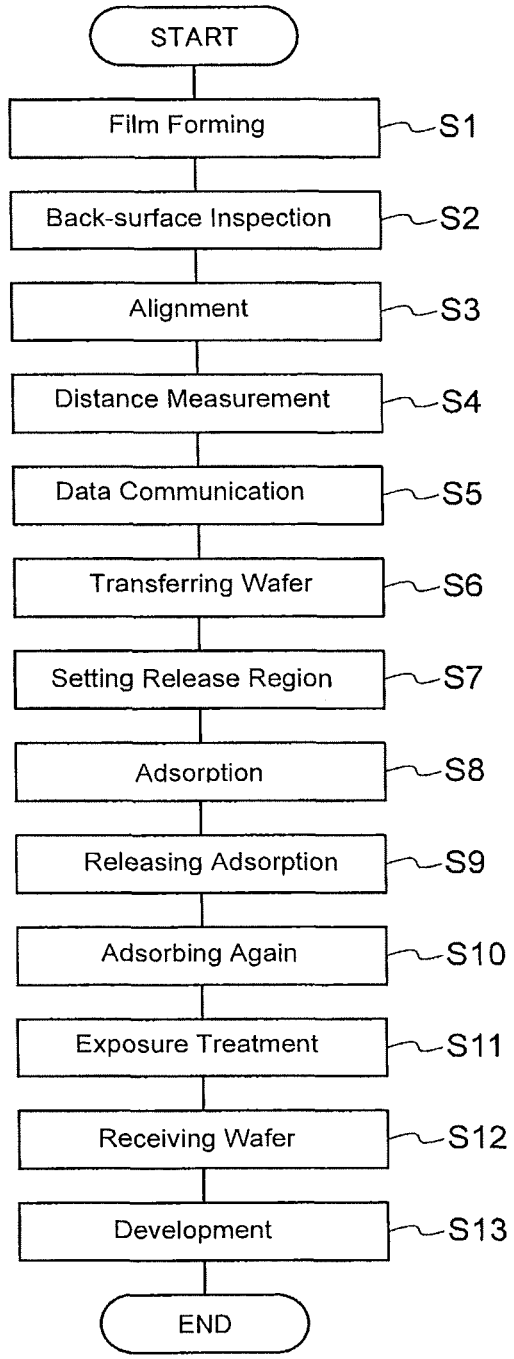
FIG. 7 is a flowchart showing steps for executing a substrate processing method.

In the following, a substrate processing method using substrate processing system 1 is described with reference to FIG. 7. First, film-forming control sub-device 111 controls coating/development apparatus 2 so that a bottom-layer film, a resist film and a top-layer film are formed on front surface (Wa) of a wafer (W) (step S1). Specific operations of coating/development apparatus 2 are as follows.

Delivery arm (A1) transfers a wafer (W) in carrier 11 to shelf unit (U10). The wafer (W) is placed by elevator arm (A7) into a cell for BCT module 14, and is transferred by transfer arm (A2) to each unit in BCT module 14. The coating unit coats front surface (Wa) with a chemical solution for forming a bottom-layer film. The thermal-treatment unit performs thermal treatment to cure the chemical solution. When the bottom-layer film is formed, transfer arm (A2) returns the wafer (W) to shelf unit (U10).

The wafer (W) is placed by elevator arm (A7) into a cell for COT module 15, and is transferred by transfer arm (A3) to each unit in COT module 15. Coating unit (U1) coats the front surface (Wa) with a chemical solution for forming a resist film. Thermal-treatment unit (U2) performs thermal treatment (PAB) or the like to cure the chemical solution. When forming a resist film is completed, transfer arm (A3) returns the wafer (W) to shelf unit (U10).

The wafer (W) is placed by elevator arm (A7) into a cell for TCT module 16, and transferred by transfer arm (A4) to each unit in TCT module 16. The coating unit coats the front surface (Wa) with a chemical solution for forming a top-layer film. The thermal-treatment unit performs thermal treatment or the like to cure the chemical solution. When forming the top-layer film is completed, transfer arm (A4) returns the wafer (W) to shelf unit (U10).

Next, back-surface inspection control sub-device 113 controls coating/development apparatus 2, and inspects back surface (Wb) of the wafer (W) to determine whether contaminants are attached thereon (step S2). More specifically, coating/development apparatus 2 operates as follows.

The wafer (W) returned to shelf unit (U10) by transfer arm (A4) is placed by elevator arm (A7) into a cell for DEV module 17, and transferred to shelf unit (U11) by direct transfer arm (A6). The wafer (W) is loaded into BSI unit 20 and is placed on holding device 40 by delivery arm (A8).

Figure 8:
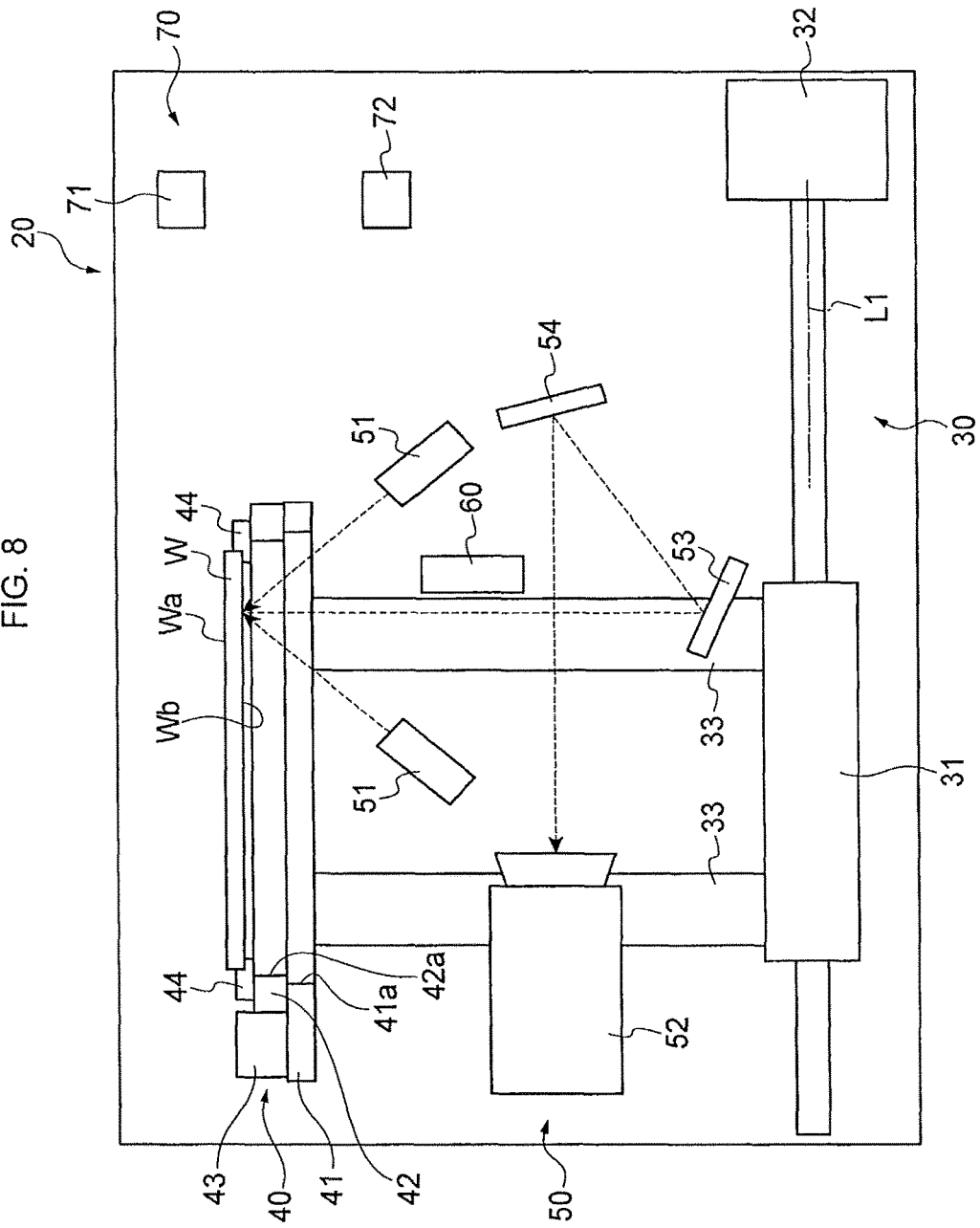
FIG. 8 is a view schematically showing the BSI unit performing a back-surface inspection.

BSI unit 20 moves the wafer (W) by using transfer device 30 to change imaging spots so that back-surface inspection device 50 inspects whether there are contaminants attached thereon (see FIG. 8). Lighting source 51 of back-surface inspection device 50 illuminates back surface (Wb). Mirrors (53, 54) direct the image of the portion illuminated by lighting source 51 to imaging device 52 so that imaging device 52 acquires the image. Back-surface inspection device 50 executes an imaging process to detect contaminants from the image obtained by imaging device 52.

Figure 9:
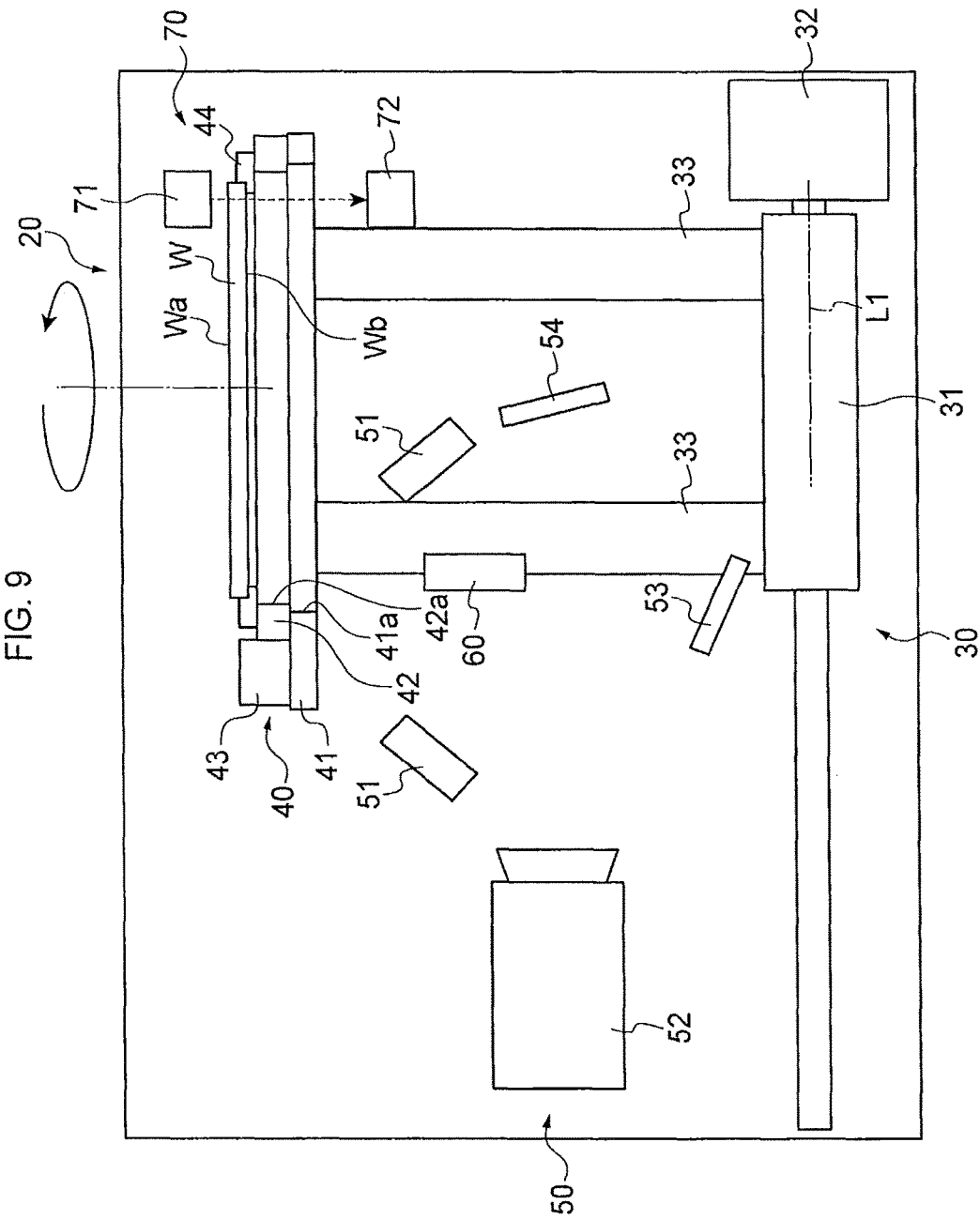
FIG. 9 is a view schematically showing the BSI unit performing base point detection.

Next, alignment control sub-device 114 controls coating/development apparatus 2 to align the wafer (W) (step S3). More specifically, coating/development apparatus 2 operates as follows. Namely, after an inspection for contaminants is completed, the wafer (W) is transferred by transfer device 30 so that the periphery of the wafer (W) is positioned between light source 71 and light receiver 72 of base point detection device 70 (see FIG. 9). Except for when the notch (Wc) is positioned between light source 71 and light receiver 72, the light from light source 71 is blocked by the periphery of the wafer (W) and does not reach light receiver 72. If light does not reach light receiver 72, actuator 43 rotates turntable 42 and stops the rotation when the light from light source 71 does reach light receiver 72 (see FIGS. 12(a) and 12(b)). Accordingly, the notch (Wc) of the wafer (W) is positioned between light source 71 and light receiver 72, and the wafer (W) is aligned.

Figure 10:
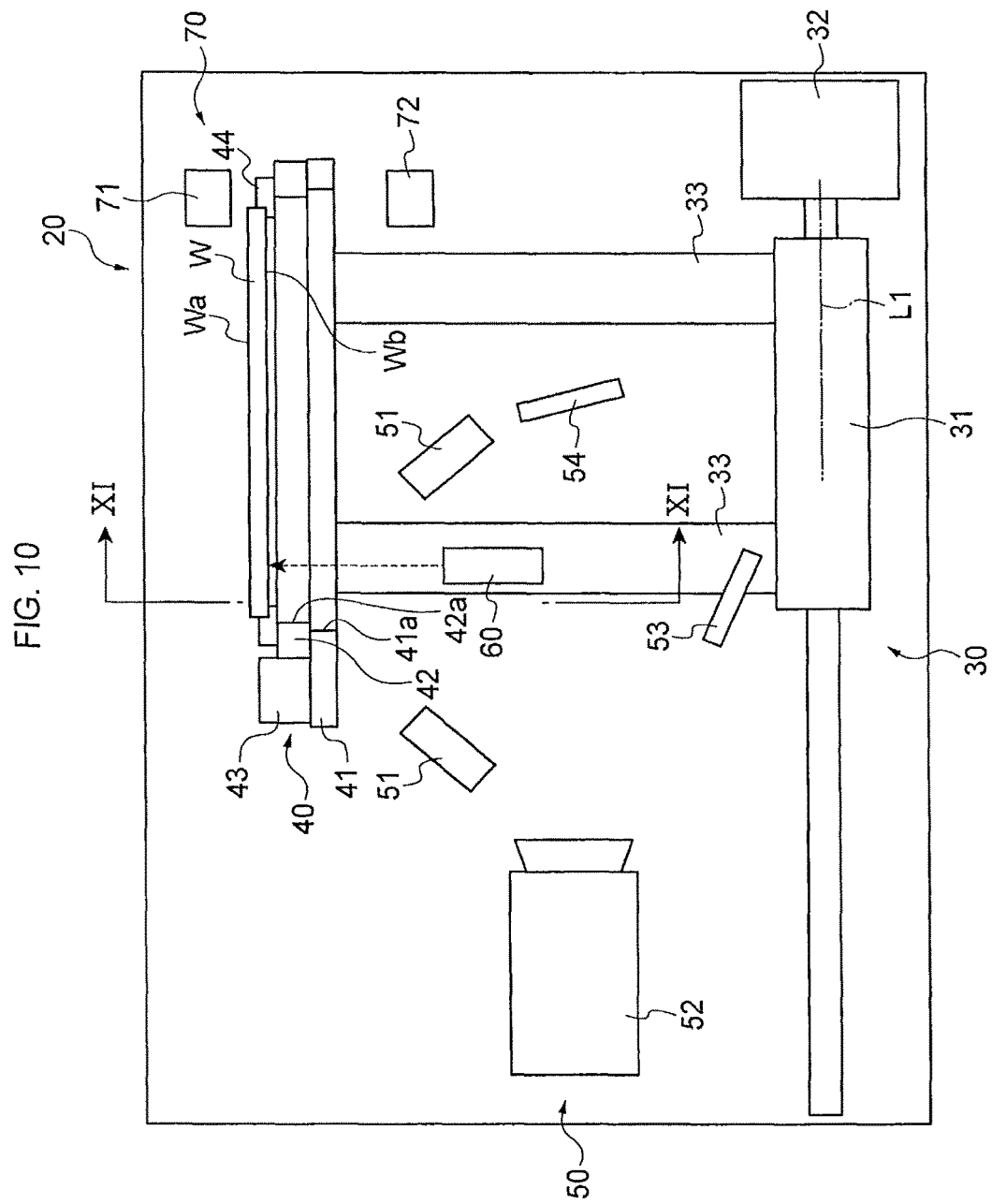
FIG. 10 is a view schematically showing the BSI unit measuring the distance to the back surface.

Next, measuring control sub-device 115 controls coating/development apparatus 2 and obtains the measured warping data of the wafer (W) (step S4). More specifically, coating/development apparatus 2 operates as follows. Namely, as holding device 40 holds the periphery of the wafer (W), transfer device 30 transfers the wafer (W) to multiple measuring spots. When the wafer (W) is placed in each measuring spot, measuring device 60 measures the distance to back surface (Wb) (see FIG. 10).

Laser light source 61 of measuring device 60 irradiates laser light to back surface (Wb), and light receiver 62 of measuring device 60 receives the light reflected at the irradiated spot (see FIG. 11). By a triangulation method using the light emitting direction of laser light from laser light source 61 to back surface (Wb) and the light incidence direction from the irradiated spot to light receiver 62, measuring device 60 measures the distance to the irradiated spot. Measuring device 60 moves laser light source 61 and light receiver 62 to change laser irradiation spots in a direction perpendicular to axis (L1) (the direction in which a wafer (W) is transferred by transfer device 30), and measures the distance to the irradiated spots. By transferring the wafer (W) along axis (L1) while moving irradiation spots along a line perpendicular to axis (L1), measurements are obtained along multiple measurement lines (L2) perpendicular to axis (L1) (see FIG. 12(c)).

When the acquisition of data measured along measurement line (L2) is finished, actuator 43 rotates turntable 42 and the wafer (W) 90 degrees (see FIG. 12(d)). Then, the same as above, transfer device 30 transfers the wafer (W) to multiple measuring spots and measuring device 60 measures the distance to back surface (Wb) every time the wafer (W) is placed at each measuring spot. Accordingly, the distance is measured along multiple measurement lines (L3) perpendicular to measurement lines (L2) (see FIG. 12(e)). As a result, in addition to transferring a wafer (W) along axis (L1) while moving irradiation spots along a line perpendicular to axis (L1), by further rotating the wafer (W), measurements are obtained along grid lines. Here, measurement lines (L2, L3) may be set to avoid contaminants detected in step (S2).

BSI unit 20 conducts calculations to remove the self-weight factor of the wafer (W) from the measurement values obtained by measuring device 60, and obtains the calculation results as measured warping data.

Next, communication control sub-device 116 controls coating/development apparatus 2 to transmit measured warping data of the wafer (W) to exposure device 3 (step S5). More specifically, coating/development apparatus 2 operates as follows. Namely, communication device 200 transmits to exposure device 3 the measured warping data of the wafer (W) obtained by BSI unit 20.

Next, relay control sub-device 117 controls coating/development apparatus 2, and transfers the wafer (W) to exposure device 3 (step S6). More specifically, coating/development apparatus 2 operates as follows. Namely, delivery arm (A8) in interface block 6 unloads a wafer (W) from BSI unit 20 and transfers the wafer to exposure device 3 (loads the wafer (W) into exposure device 3).

Next, exposure device 3 receives measured warping data of the wafer (W), and sets a release region of the wafer (W) based on the measured data (step S7). For example, when the deviation is greater than a predetermined threshold value, such a region is set as release region (R1) (see FIG. 13(*a*)).

The wafer (W) is adsorbed onto a mounting plate in exposure device 3 (step S8, see FIG. 13(*b*)). At that time, release region (R1) may be forced flat while the periphery of release region (R1) is constrained from moving. In such a case, since release region (R1) is forced to be smaller, the size of release region (R1) changes before and after the adsorption process. Change in size decreases the accuracy of exposure treatment (for example, dimensional accuracy of the pattern formed by exposure treatment).

Therefore, exposure device 3 releases adsorption in release region (R1) and in region (R2) which extends from release region (R1) to the periphery of the wafer (W) (step S9, see FIG. 13(*c*)).

Next, exposure device 3 again adsorbs release region (R1) by expanding adsorption region (R3) of the wafer (W) toward the peripheral side of the wafer (W) (step S10, see FIGS. 13(*d*)~13(*f*)). As a result, release region (R1) is adsorbed again while its edge along the periphery of the wafer (W) is opened. Accordingly, a decrease in the size of release region (R1) is suppressed.

Next, exposure device 3 performs exposure treatment on the resist film (step S11). Relay control sub-device 117 controls coating/development apparatus 2, and receives the wafer (W) from exposure device 3 (step S12). More specifically, coating/development apparatus 2 operates as follows. Delivery arm (A8) of interface block 6 receives the wafer (W) from exposure device 3 after exposure treatment and transfers it to shelf unit (U11).

Next, development control sub-device 112 controls coating/development apparatus 2, and performs developing treatment on the resist film (step S13). More specifically, coating/development apparatus 2 operates as follows. Namely, transfer arm (A5) transfers the wafer (W) in shelf unit (U11) to thermal-treatment unit (U4) in DEV module 17. Thermal-treatment unit (U4) performs thermal treatment (PEB) on the wafer (W). When PEB is completed, transfer arm (A5) transfers the wafer (W) to development unit (U3). Development unit (U3) supplies a developing solution and a rinsing solution to the front surface of the wafer (W) and performs developing treatment on the resist film. When developing treatment is completed, transfer arm (A5) transfers the wafer (W) again to thermal-treatment unit (U4). Thermal-treatment unit (U4) performs thermal treatment (PB) on the wafer (W). When PB is completed, transfer arm (A5) transfers the wafer (W) to shelf unit (U10). Elevator arm (A7) places the wafer (W) into a delivery cell and delivery arm (A1) returns the wafer (W) to carrier 11.

A substrate processing method is completed. Steps (S7)~(S11) are performed by controlling exposure device 3. Such controls are conducted by a control device (not shown) for exposure device 3. The programs for exposure device 3 to execute steps (S7)~(S11) are stored in a computer readable memory medium and read out by the control device for exposure device 3. Examples of a memory medium are a hard disk, a compact disc, flash memory, a flexible disk, a memory card and the like.

As described so far, coating/development apparatus 2 transmits measured warping data of a wafer (W) to exposure device 3. The measured warping data are obtained after the film is formed (after the photosensitive film is formed). The degree of warping of a wafer (W) after the film is formed is approximately the same degree of warping of the wafer shortly before the wafer is transferred to exposure device 3. Thus, the measured data transmitted to exposure device 3 are effective in reducing the impact on exposure treatment caused by warping of a wafer (W). In addition, measured warping data are measured before the wafer (W) is transferred to exposure device 3. Thus, measured data are obtained after the film is formed on a wafer (W) while the wafer waits for its turn to be transferred to exposure device 3. Accordingly, coating/development apparatus 2 is capable of reducing the impact on exposure treatment caused by warping of a wafer (W), and of suppressing a decrease in throughput.

For example, as shown in a substrate processing method using substrate processing system 1, change in the size of a wafer (W) caused by adsorption is suppressed, and accuracy of exposure treatment is enhanced.

BSI unit 20 has holding device 40 to hold the periphery of a wafer (W), and measuring device 60 to measure warping of a wafer (W) held by holding device 40. Since measured warping data are affected by the self-weight of a wafer (W), calculations to remove the self-weight factor from the measured values are conducted to determine the degree of warping of the wafer (W). To obtain measured values, if the periphery of a wafer (W) is held, the self-weight factor of the wafer (W) is easier to estimate, thereby making it easier to measure the degree of warping.

Measuring device 60 is disposed on the back surface (Wb) side of a wafer (W) held by holding device 40, and it measures the distance to back surface (Wb). Thus, measuring device 60 is capable of determining the distance without being affected by irregular patterns formed on the front surface (Wa) of a wafer (W). Accordingly, warping of the wafer (W) is determined even more accurately.

BSI unit 20 is further provided with back-surface inspection device 50 to detect contaminants attached to back surface (Wb). Thus, BSI unit 20 is also used for inspection of contaminants, thus contributing to making the apparatus smaller.

BSI unit 20 is further provided with transfer device 30 to transfer a wafer (W) so as to change spots where back-surface inspection device 50 takes images. Measuring device 60 moves irradiation spots of laser light in a direction intersecting the direction in which a wafer (W) is moved by transfer device 30, and measures the distance to the irradiated spots. Thus, in a transfer direction of a wafer (W), irradiation spots of laser light are moved when the wafer (W) is transferred by transfer device 30, whereas in a direction intersecting the transfer direction, irradiation spots of laser light are moved by measuring device 60. Accordingly, irradiation spots of laser light are set in a wider range of a wafer (W). Transfer device 30 is effectively used for inspection of contaminants, and measurement is conducted on a wider range.

Back-surface inspection device 113 controls BSI unit 20 so that back-surface inspection device 50 inspects contaminants before the process controlled by measuring control sub-device 115. Thus, measurement spots can be set by measuring device 60 to avoid contaminants, and more accurate data are obtained to determine warping of the wafer (W).

Measuring device 60 may be disposed on the front surface (Wa) side of a wafer (W) to measure the distance to the front surface (Wa). It is an option for BSI unit 20 not to be accommodated in interface block 6, but rather to be accommodated in any module in processing block 5. It is sufficient for coating/development apparatus 2 to have a film-forming device for forming a photosensitive film, a relay device, a warping data acquisition device and a communication device, and a control device to control those devices. It is an option for coating/development apparatus 2 to include BCT module 14, TCT module 16 and DEV module 17. It is also an option for the warping data acquisition device not to include back-surface inspection device 50, and to be used exclusively for obtaining measured warping data.

Procedures in the substrate processing method above may be conducted in different orders. For example, alignment of a wafer (W) (step S3) may be conducted before back-surface inspection (step S2), transferring a wafer (W) (step S6) may be conducted before transmitting the measured data (step S5), or setting release region (R1) (step S7) may be conducted before transferring the wafer (W) (step S6). Setting release region (R1) (step S7) may be conducted in coating/development apparatus 2 before transmitting measured data (step S5), and release region (R1) may be transmitted to exposure device 3 along with measured warping data. Back-surface inspection (step S2) and distance measurement (step S4) may be conducted simultaneously; that is, back-surface inspection control sub-device 113 controls BSI unit 20 so that back-surface inspection device 50 inspects contaminants at the same time as the process controlled by measuring control sub-device 115 is conducted. A decrease in throughput is certainly suppressed.

Second Embodiment

Substrate Processing System

Figure 14:
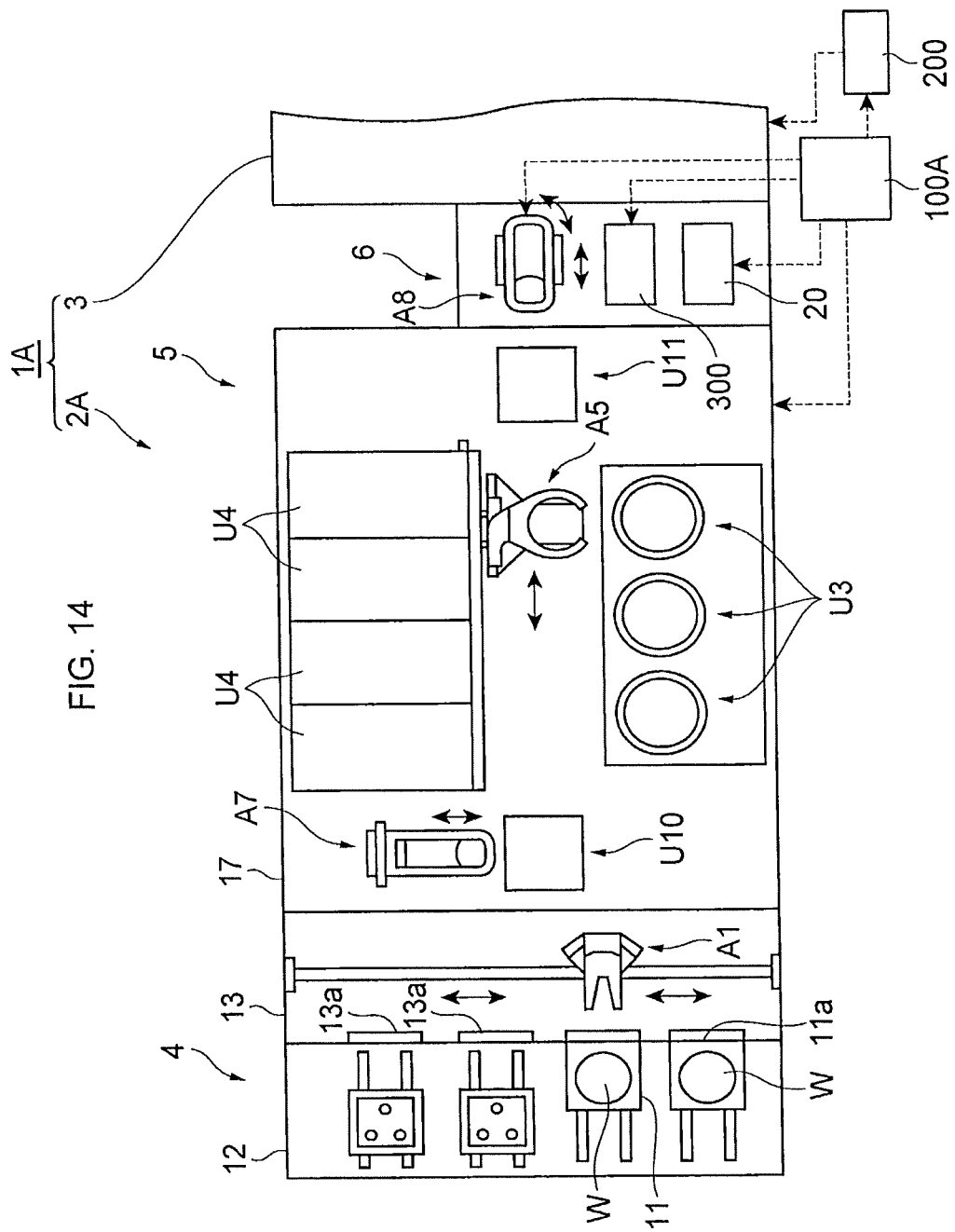
FIG. 14 shows a cross-sectional view of a substrate processing system according to a second embodiment of the present invention.

As shown in FIG. 14, in substrate processing system (1A) according to a second embodiment, coating/development apparatus 2 of substrate processing system 1 is replaced with coating/development apparatus (2A). In coating/development apparatus (2A), roughening process unit 300 is added to coating/development apparatus 2 and control device 100 is replaced with control device (100A).

Figure 15:
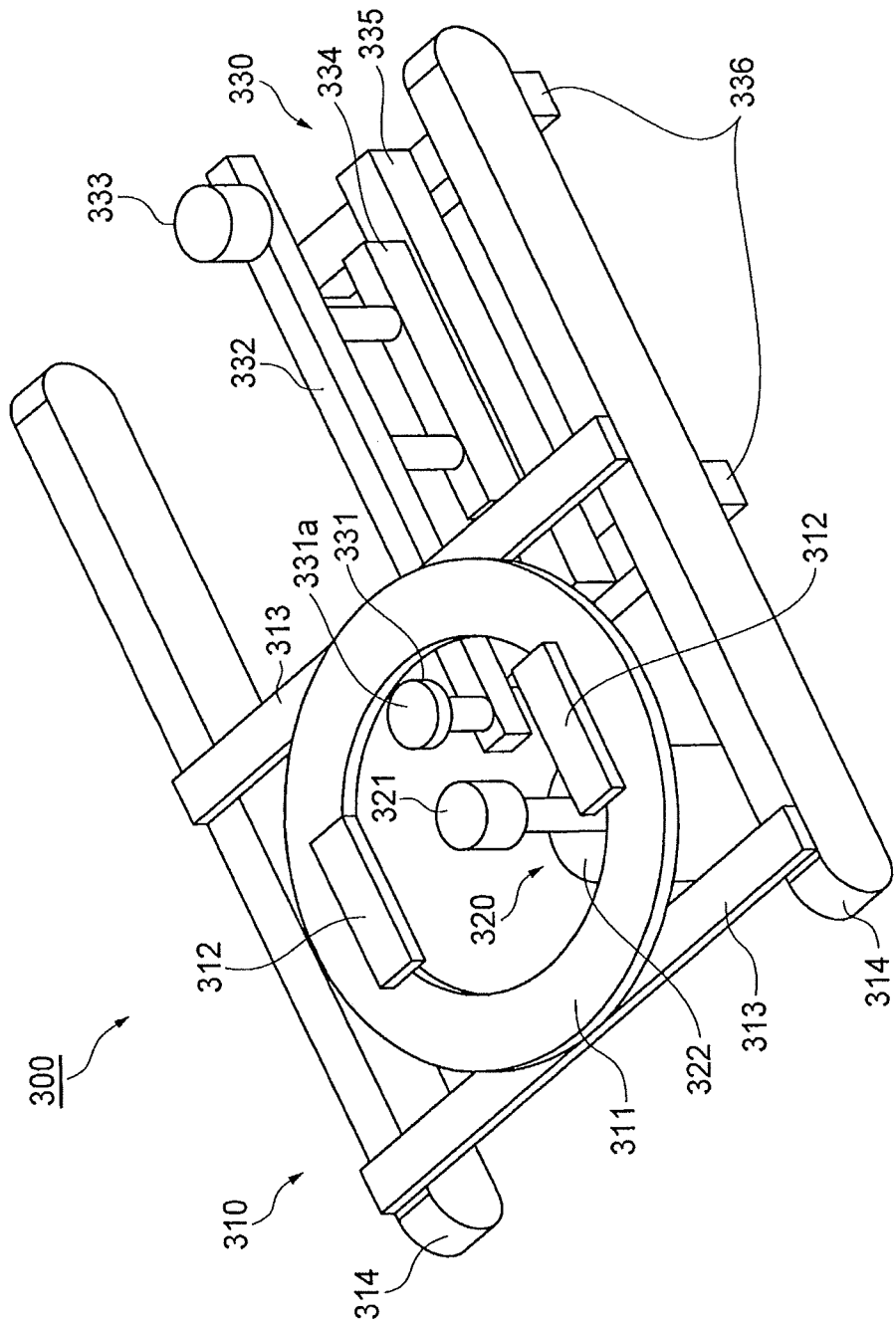
FIG. 15 is a perspective view schematically showing the structure of a roughening process unit.

Roughening process unit 300 is an example of a roughening process device to roughen the back surface of a wafer (W). Roughening means to roughen a surface by polishing, for example. As shown in FIG. 15, roughening process unit 300 has periphery holding mechanism 310, center holding mechanism 320 and polishing mechanism 330.

Periphery holding mechanism 310 holds the periphery of a wafer (W) and transfers the wafer along a horizontal straight line. In the following, a direction along the straight line is referred to as a transfer direction of a wafer (W). Periphery holding mechanism 310 is provided with support plate 311, a pair of adsorbable holding devices (312, 312), a pair of beam members (313, 313), and a pair of transfer devices (314, 314). Support plate 311 is in a ring shape, and its inner diameter is set greater than the outer diameter of a wafer (W). A pair of adsorbable holding devices (312, 312) is positioned along the inner periphery of support plate 311. Adsorbable holding devices (312, 312) are positioned to face each other in a direction perpendicular to the transfer direction of a wafer (W), and each protrudes toward the center of support plate 311. Adsorbable holding devices (312, 312) support a wafer (W) from under the wafer and hold the wafer by vacuum adsorption, for example. Beam members (313, 313) are arranged along the transfer direction of a wafer (W) to be perpendicular to the transfer direction of a wafer (W). Beam members (313, 313) support the outer periphery of support plate 311. Transfer devices (314, 314) support both ends of beam members (313, 313), and move in a transfer direction of a wafer (W) so that the wafer (W) supported by adsorbable holding devices (312, 312) is transferred.

Center holding mechanism 320 is positioned between transfer devices (314, 314), and holds and rotates the central portion of a wafer (W). Center holding mechanism 320 includes adsorbable holding device 321 and elevator/rotary device 322. Adsorbable holding device 321 supports the central portion of a wafer (W) from under the wafer, and holds the wafer by vacuum adsorption, for example. Elevator/rotary device 322 supports adsorbable holding device 321 from under the device. Elevator/rotary device 322 has a built-in elevation power source such as an air cylinder or a solenoid and a rotation power source such as an electric motor, and lifts/lowers/rotates adsorbable holding device 321.

Polishing mechanism 330 is arranged to be positioned side by side with center holding mechanism 320 along the transfer direction of a wafer (W), and polishes back surface (Wb) of a wafer (W) held by periphery holding mechanism 310 or center holding mechanism 320 so that the back surface is roughened. Polishing mechanism 330 is provided with polishing plate 331, rotary drive device 332, elevator device 334, transfer device 335, and transfer device 336. Polishing plate 331 is in a disc shape and polishes an object using its upper surface (331a). Rotary drive device 332 supports polishing plate 331 from under the plate. Rotary drive device 332 has power source 333 such as an electric motor. Power source 333 rotates polishing plate 331 around the vertical axis. Elevator device 334 supports rotary drive device 332 from under the device. Elevator device 334 has a built-in power source such as an air cylinder or a solenoid for lifting/lowering rotary drive device 332, and polishing plate 331 is lifted/lowered accordingly. Transfer device 335 supports elevator device 334 from under the device. Transfer device 335 has a built-in power source such as an electric motor, and transfers elevator device 334 in the transfer direction of a wafer (W). As a result, polishing plate 331 moves in the transfer direction of a wafer (W). Transfer device 336 supports transfer device 335 from under transfer device 335. Transfer device 336 has a built-in power source such as an electric motor, and moves transfer device 335 in a direction perpendicular to the transfer direction of a wafer (W). Accordingly, polishing plate 331 moves in a direction perpendicular to the transfer direction of a wafer (W).

Figure 16:
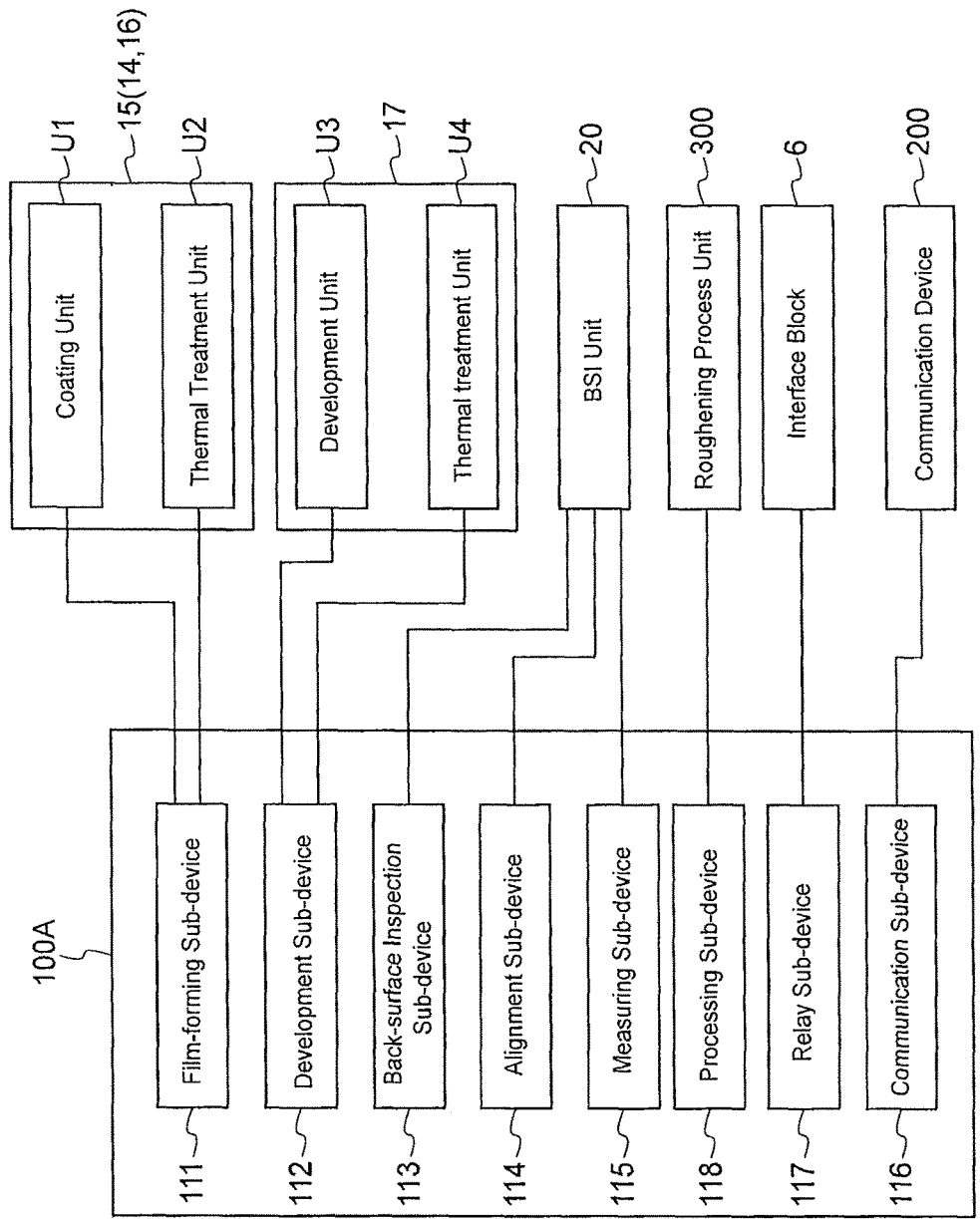
FIG. 16 is a diagram showing the functional structure of a control device.

As shown in FIG. 16, control device (100A) is obtained by adding processing control sub-device 118 to control device 100. Processing control sub-device 118 is also a functional block, not a block of a hardware structure. Processing control sub-device 118 controls roughening process unit 300 so that roughening is performed on back surface (Wb) of a wafer (W) based on measured warping data of the wafer (W).

Substrate Processing Method

Figure 17:
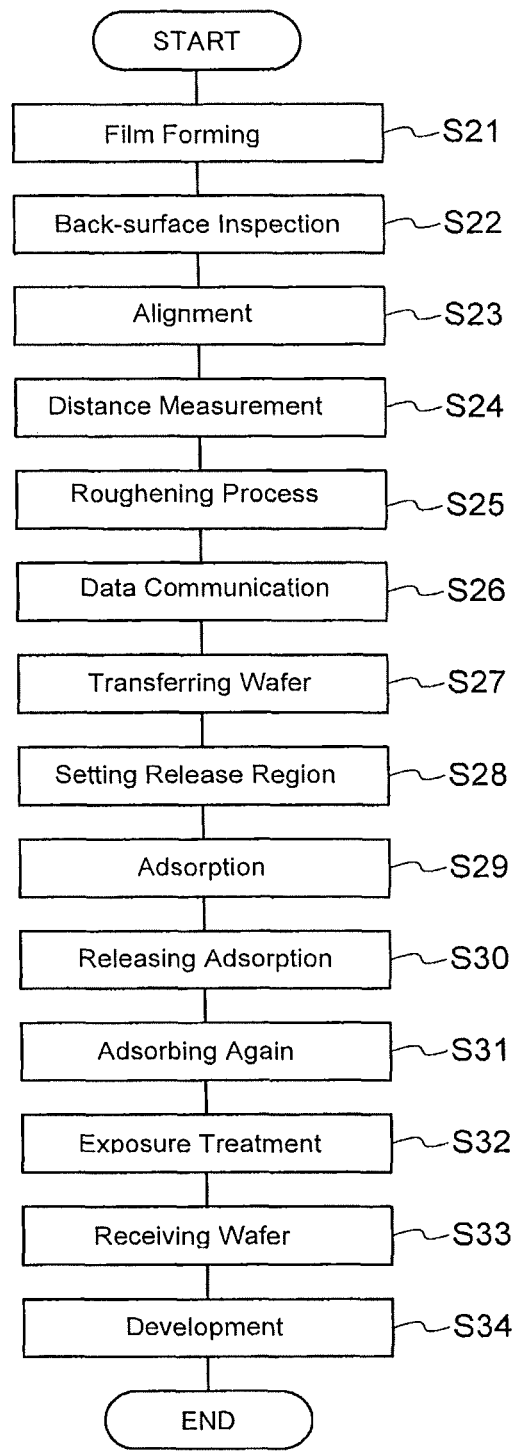
FIG. 17 is a flowchart showing steps for executing a substrate processing method.

As shown in FIG. 17, a substrate processing method using substrate processing system (1A) includes steps (S21)~(S24) corresponding to (S1)~(S4) described above, step (S25), and steps (S26)~(S34) corresponding to the above steps (S5)~(S13).

In step (S25), processing control sub-device 118 controls roughening process unit 300 so that back surface (Wb) of a wafer (W) is roughened based on the measured warping data of the wafer (W) obtained in step (S24). For example, based on the measured warping data, processing control sub-device 118 controls roughening process unit 300 to roughen back surface (Wb) when back surface (Wb) is found to be in a concave shape, but not to roughen back surface (Wb) in other conditions.

Namely, the substrate processing method using substrate processing system (1A) includes roughening back surface (Wb) of a wafer (W) based on the measured warping data of the wafer (W) after the process controlled by measuring control sub-device 115 but before the process controlled by relay control sub-device 117. In the substrate processing method, based on the measured warping data, back surface (Wb) of a wafer (W) is roughened when back surface (Wb) is found to be in a concave shape, but is not roughened in other conditions.

Figure 18:
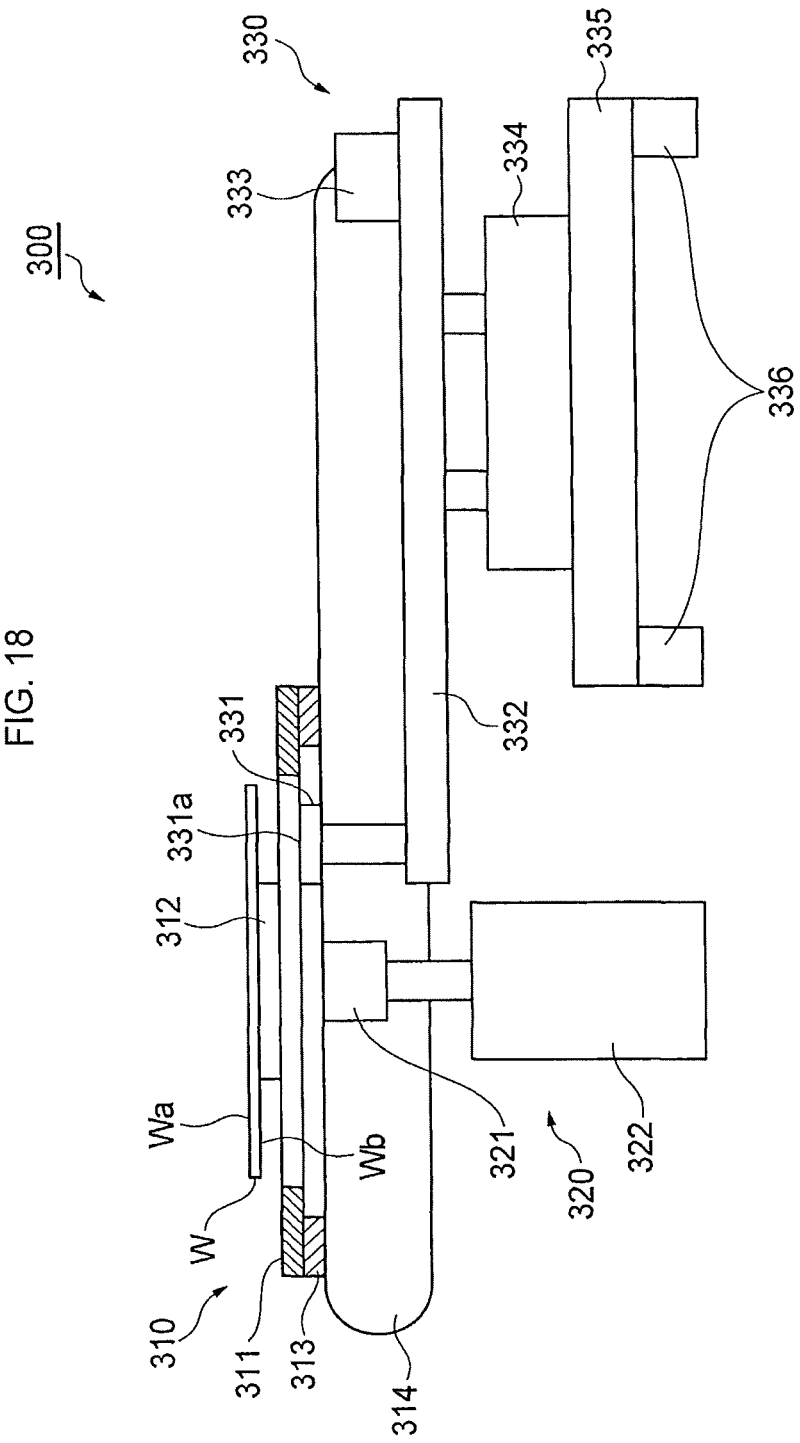
FIG. 18 is a view schematically showing a roughening process unit when a wafer is loaded.

As shown in FIG. 18, when back surface (Wb) is roughened, processing control sub-device 118 controls delivery arm (A8) so that a wafer (W) is placed on adsorbable holding devices (312, 312) and then controls roughening process unit 300 so that the wafer (W) is adsorbed by adsorbable holding devices (312, 312).

Figure 19:
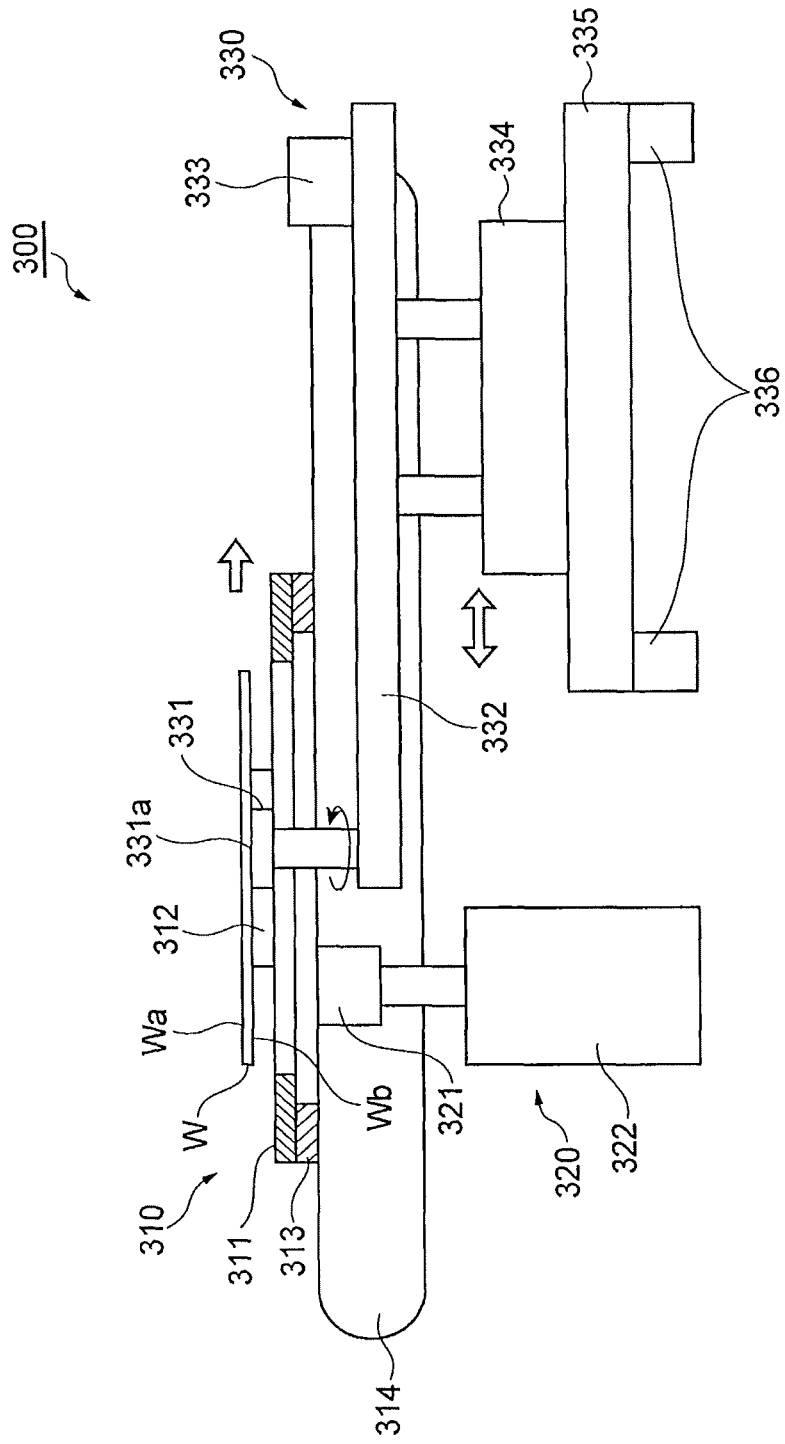
FIG. 19 is a view schematically showing the roughening process unit polishing the central portion of the back surface of a wafer.
Figure 20:
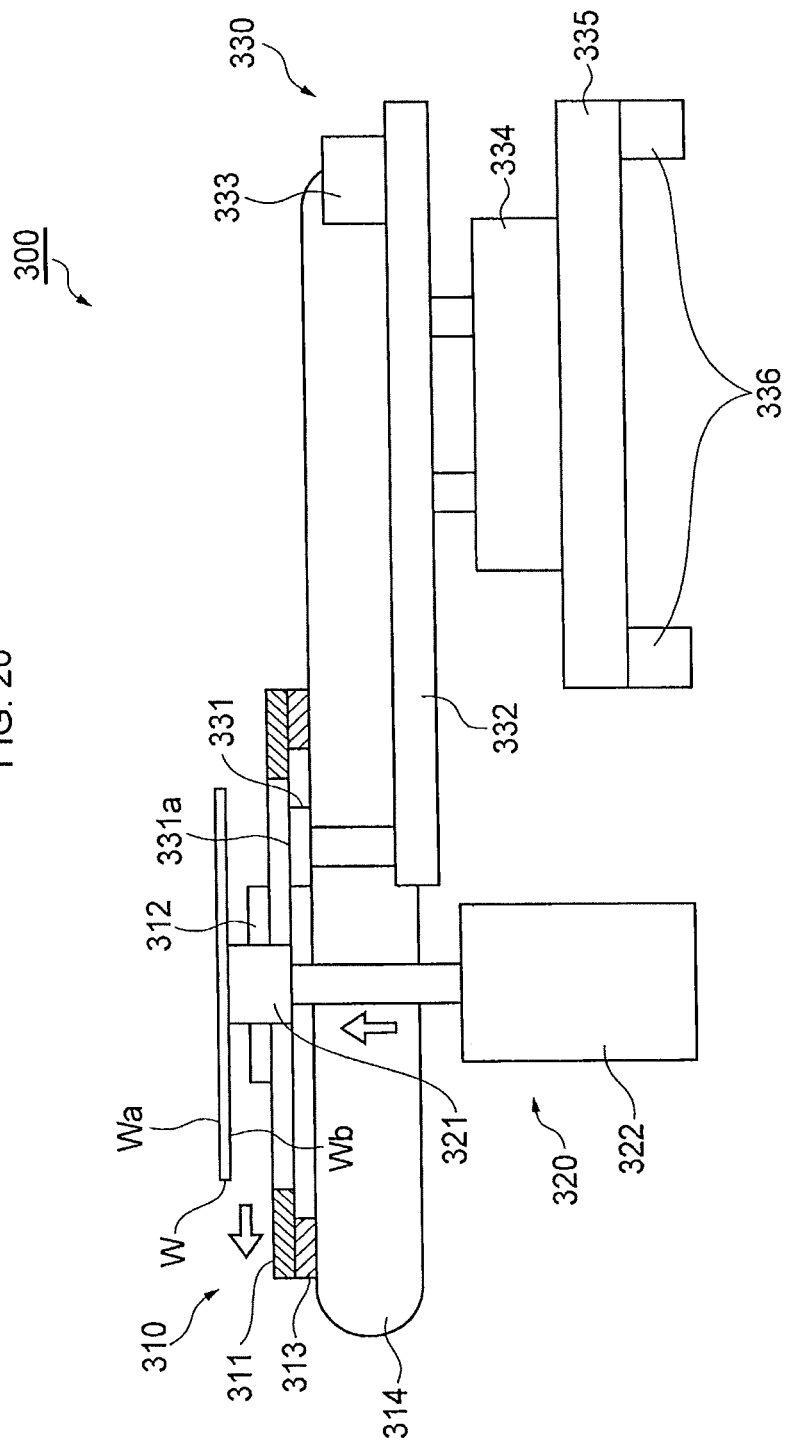
FIG. 20 is a view schematically showing the roughening process unit where the central portion of a wafer is adsorbed.

Next, processing control sub-device 118 controls roughening process unit 300 so that transfer devices (314, 314) transfer the wafer (W) to place the center of the wafer (W) on polishing plate 331 as shown in FIG. 19. Then, processing control sub-device 118 controls roughening process unit 300 so that rotary drive device 332 rotates polishing plate 331 and elevator device 334 lifts polishing plate 331, pressing upper surface (331a) of rotating polishing plate 331 against back surface (Wb). As a result, the central portion of back surface (Wb) is polished and roughened. Moreover, processing control sub-device 118 controls roughening process unit 300 to move polishing plate 331 by transfer device 335 and transfer device 336. Accordingly, the range to be roughened is enlarged.

Processing control sub-device 118 controls roughening process unit 300 so that polishing plate 331 is lowered by elevator device 334, a wafer (W) is transferred by transfer devices (314, 314), and the central portion of the wafer (W) is positioned on adsorbable holding device 321. Processing control sub-device 118 controls roughening process unit 300 so that adsorption by adsorbable holding devices (312, 312) is released, adsorbable holding device 321 is lifted by elevator/rotary device 322, and the wafer (W) is adsorbed by adsorbable holding device 321.

Figure 21:
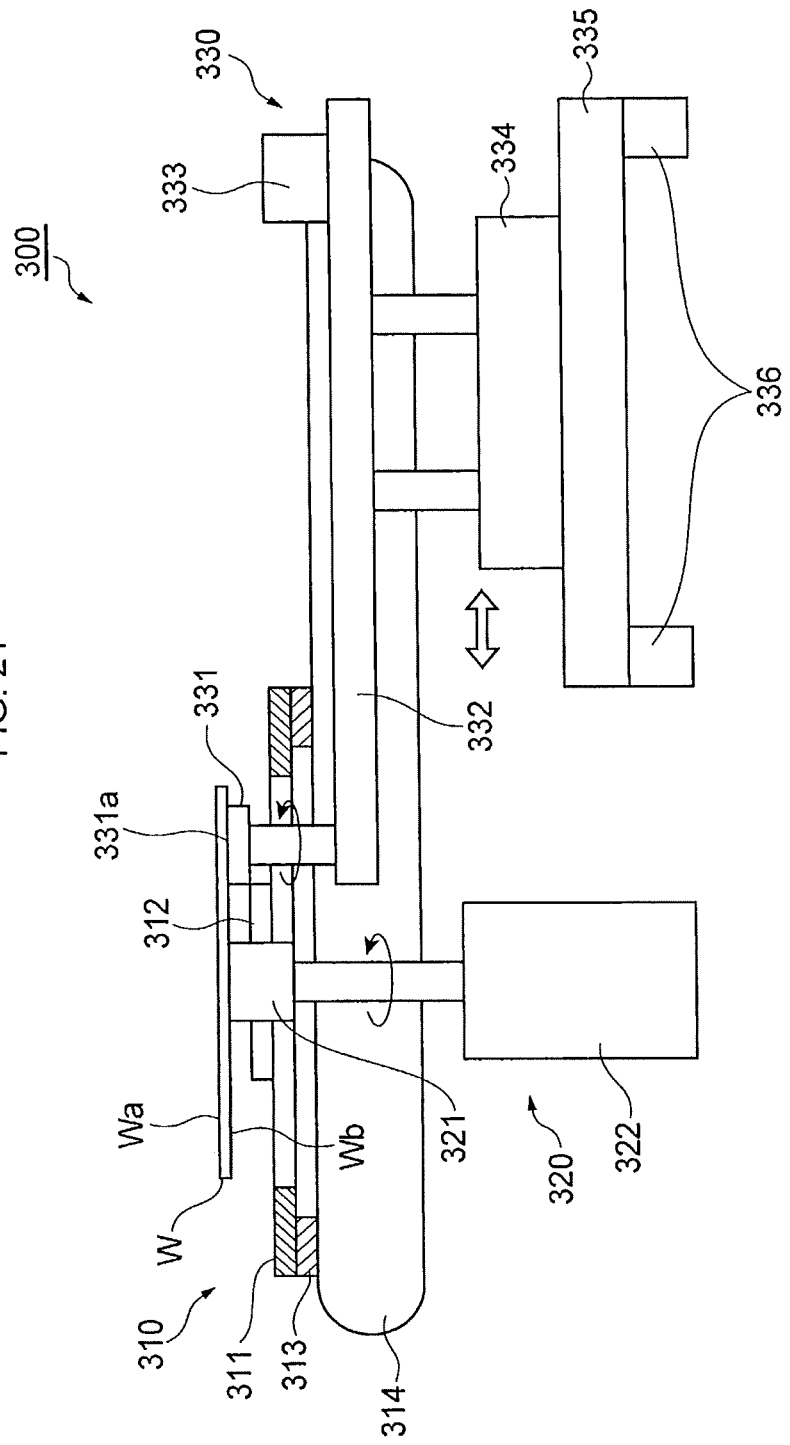
FIG. 21 is a view schematically showing the roughening process unit polishing the periphery of the back surface of a wafer.

Next, processing control sub-device 118 controls roughening process unit 300 so that the wafer (W) is rotated by elevator/rotary device 322 as shown in FIG. 21. Then, processing control sub-device 118 controls roughening process unit 300 so that polishing plate 331 is rotated by rotary drive device 332 and polishing plate 331 is lifted by elevator device 334, pressing upper surface (331a) of rotating polishing plate 331 against back surface (Wb). As a result, the periphery of back surface (Wb) is polished and roughened. Moreover, processing control sub-device 118 controls roughening process unit 300 so that polishing plate 331 is moved by transfer device 335. Accordingly, the range to be roughened is enlarged. As described above, since the central portion of back surface (Wb) is already roughened, when the processing range in the periphery of back surface (Wb) is enlarged, the entire region of back surface (Wb) is roughened. The roughening process of back surface (Wb) is completed.

As described above, coating/development apparatus (2A) is further provided with roughening process unit 300 for roughening back surface (Wb) of a wafer (W). Control device (100A) further includes processing control sub-device 118 that controls roughening process unit 300 so that back surface (Wb) of a wafer (W) is roughened based on measured warping data after the process controlled by measuring control sub-device 115 but before the process controlled by relay control sub-device 117.

When a warped wafer (W) is positioned on a mounting plate of exposure device 3, the wafer (W) is forced flat during the adsorption process or the like. At that time, if back surface (Wb) of the wafer (W) does not slide well on the mounting plate of exposure device 3, the degree of distortion of wafer (W) increases when it is made flat, and accuracy may decrease during the exposure treatment. By contrast, by roughening back surface (Wb) of a wafer (W), Coulomb's force decreases between the mounting plate of exposure device 3 and back surface (Wb) of the wafer (W), and the back surface will slide well. As a result, a decrease in exposure accuracy caused by distortion of the wafer (W) is suppressed. In addition, by roughening a wafer (W) based on the measured warping data, the roughening process is set at an appropriate degree, and a decrease in throughput is suppressed. Accordingly, coating/development apparatus (2A) is also effective in suppressing a decrease in throughput while reducing the impact on exposure treatment caused by warping of a wafer (W).

For example, based on the measured warping data, processing control sub-device 118 may control roughening process unit 300 in such a way that back surface (Wb) is roughened when it is found to be concave shape, but is not roughened in other conditions.

When no warping is found on back surface (Wb), distortion of a wafer (W) is unlikely to occur on the mounting plate of exposure device 3. When back surface (Wb) of a wafer (W) is in a convex shape, its central portion first touches the mounting plate of exposure device 3. Thus, the periphery of the wafer (W) is less likely to be constrained when the wafer is adsorbed on the surface, and distortion tends not to occur in the wafer. When back surface (Wb) of a wafer (W) is in a concave shape, the periphery of the wafer (W) first touches the mounting plate of exposure device 3. Thus, the periphery of the wafer (W) is more likely to be constrained from moving when the wafer (W) is adsorbed onto the mounting plate, and distortion of the wafer (W) tends to occur. Therefore, back surface (Wb) is roughened only when the back surface is found to be in a concave shape so that a decrease in throughput is suppressed while the impact on exposure treatment is also suppressed.

However, processing control sub-device 118 may also control processing unit 300 to roughen back surface (Wb) even when no warping is found on the back surface or when the back surface is in a convex shape. By roughening back surface (Wb) in all conditions, the impact caused by warping of a wafer (W) further decreases during the exposure treatment. Moreover, roughening process unit 300 may be controlled to lower the roughening degree on the back surface (Wb) when no warping is found on the back surface or the back surface (Wb) is in a convex shape, compared with the roughening degree of the back surface (Wb) when the back surface (Wb) is in a concave shape. Alternatively, roughening process unit 300 may be controlled so that the roughening degree on back surface (Wb) of a wafer (W) is the same in all the conditions.

So far, embodiments of the present invention have been described. However, the present invention is not limited to the above, and various modifications are possible within a scope that does not deviate from the gist of the present invention. For example, in a structure that includes roughening process unit 300 as in coating/development apparatus (2A), communication control sub-device 116 and communication device 200 are not always necessary. Also, in a substrate processing method using substrate processing system (1A), transmitting measured warping data of a wafer (W) to exposure device 3 (step S26) and adsorbing the wafer (W) again in exposure device 3 based on the measured data (steps S28~S31) are not always required. Even when communication control sub-device 116 and communication device 200 are not provided, using coating/development apparatus (2A) is effective in suppressing a decrease in throughput while lowering the impact of warping of a wafer (W) during the exposure treatment.

A substrate to be processed is not limited to a semiconductor wafer. For example, it may be a glass substrate, a mask substrate or a flat panel display (FPD).

In the process for manufacturing semiconductors, procedures such as film forming, exposure and development are performed on wafers (substrates). During those procedures, warping may occur in a wafer. Using a method for measuring warping described in JP H10-199947A, since exposure treatment is not conducted while the degree of warping is measured, throughput may decrease.

The substrate processing apparatuses, substrate processing methods and a memory medium according to embodiments of the present invention are capable of suppressing a decrease in throughput while lowering the impact of substrate warping during the exposure treatment.

A substrate processing apparatus according to an embodiment of the present invention is provided with the following: a film-forming device to form a photosensitive film on a front surface of a substrate; a relay device disposed between the film-forming device and an exposure device; a warping data acquisition device to obtain measured warping data of a substrate; a communication device to conduct data communication with the exposure device; and a control device to control the film-forming device, relay device, warping data acquisition device and communication device. The control device includes the following: a film-forming control sub-device for controlling the control device to form a photosensitive film on a front surface of a substrate; a relay control sub-device for controlling the relay device to transfer a substrate to the exposure device; a measuring control sub-device for controlling the warping data acquisition device to obtain measured warping data after the process controlled by the film-forming control sub-device but before the process controlled by the relay control sub-device; and a communication control sub-device for controlling the communication device to transmit the measured warping data to the exposure device.

In the substrate processing apparatus, the measured warping data of a substrate are transmitted to the exposure device. The measured warping data are obtained after the film is formed (after the photosensitive film is formed). The degree of warping of a substrate after the film is formed is approximately the same as the degree of warping of the substrate shortly before the exposure treatment. Thus, the measured data transmitted to the exposure device are effective in reducing the impact of substrate warping during exposure treatment. In addition, measured warping data are measured before the substrate is transferred to the exposure device. Thus, measured data are obtained after the film is formed on a substrate while the substrate waits for its turn to be transferred to the exposure device. Accordingly, the substrate processing apparatus is effective in suppressing a decrease in throughput while lowering the impact of warping of a substrate during the exposure treatment.

The substrate processing apparatus may further include a roughening process device to roughen the back surface of a substrate. The control device may also include a processing control sub-device that controls the roughening process device so that, after the process controlled by the measuring control sub-device but before the process controlled by the relay control sub-device, the back surface of a substrate is roughened based on the measured warping data.

In such a case, a communication control sub-device and a communication device are not always required to be provided. Namely, a substrate processing apparatus may be structured to have the following: a film-forming device to form a photosensitive film on the front surface of a substrate; a relay device disposed between the film-forming device and an exposure device; a warping data acquisition device to obtain measured warping data of a substrate; a roughening process device to roughen the back surface of a substrate. Also, the control device may include the following: a film-forming control sub-device for controlling the film-forming device to form a photosensitive film on the front surface of a substrate; a measuring control sub-device for controlling the warping data acquisition device to obtain measured warping data after the process controlled by the film-forming control sub-device; a processing control sub-device for controlling the roughening process device to roughen the back surface of a substrate based on the measured warping data after the process controlled by the measuring control sub-device; and a relay control sub-device for controlling the relay device to transfer a substrate to the exposure device after the process controlled by the processing control sub-device.

When a warped substrate is positioned on a mounting plate of the exposure device, the substrate is forced flat during the adsorption process or the like. At that time, if the back surface of the substrate does not slide well on the mounting plate of the exposure device, the degree of distortion increases when the substrate is made flat, and accuracy may decrease during the exposure treatment. By contrast, by roughening the back surface of a substrate, Coulomb's force decreases between the mounting plate of the exposure device and the back surface of the substrate, and the sliding of the back surface is enhanced. As a result, a decrease in accuracy of exposure treatment caused by distortion of the substrate is suppressed. In addition, by roughening a substrate based on the measured warping data, the roughening process is set at an appropriate degree, and a decrease in throughput is suppressed. Accordingly, the substrate processing apparatus is also effective in suppressing a decrease in throughput while lowering the impact from the warping of a substrate during the exposure treatment.

The warping data acquisition device may have a holding device to hold the periphery of a substrate and a measuring device to measure the warping of a substrate held by the holding device. Since the measured value of warping is affected by the self-weight of a substrate, calculations to remove the self-weight factor from the measured values are conducted to determine the degree of warping of the substrate. To obtain measured values, if the periphery of a substrate is held, the self-weight factor of the substrate is easier to estimate, thereby making it easier to measure the degree of warping of the substrate.

The measuring device may be positioned on the back side of a substrate held by the holding device to measure the distance to the back surface. In such a case, since the measuring device is capable of determining the distance without being affected by concavo-convex patterns formed on the front surface of a substrate, the degree of warping of the substrate is determined even more accurately.

The warping data acquisition device may further be provided with a back-surface inspection device to detect contaminants attached to the back surface. Thus, the warping data acquisition device is also used for inspecting contaminants, thereby contributing to making the apparatus smaller.

The measuring device may be a laser displacement gauge that uses laser light to measure the distance to the back surface, or the back surface inspection device may be an image inspection device that detects contaminants from the images.

The warping data acquisition device may further include a transfer device to transfer a substrate so that the spots whose images are taken by the back surface inspection device are changed. The measuring device may move laser irradiation spots in a direction that intersects with the direction in which the substrate is transferred by the transfer device, and may measure the distance to the irradiation spots.

In such a case, in a direction along the transfer direction, laser irradiation spots may be changed by moving the substrate using the transfer device, whereas in a direction that intersects with the transfer direction, laser irradiation spots may be moved by the measuring device. Accordingly, laser irradiation spots on a substrate may be moved in a wider range. Thus, the transfer device to be used for contaminant inspection may be used effectively to perform measurement in a wider range.

The control device may further include a back-surface inspection control sub-device for controlling the warping data acquisition device so that the back-surface inspection device inspects contaminants after the process controlled by the film-forming control sub-device but before the process controlled by the measuring control sub-device. In such a case, spots to be measured by the measuring device are set to avoid contaminants, and more accurate data are obtained to determine the degree of warping of the substrate.

A substrate processing method according to an embodiment of the present invention includes forming a photosensitive film on a front surface of a substrate; transferring the substrate to an exposure device; after the photosensitive film is formed but before the substrate is transferred to the exposure device, obtaining measured warping data of the substrate; and transmitting the measured warping data to the exposure device.

In the substrate processing method, measured warping data of a substrate are transmitted to an exposure device. The measured warping data are obtained after a film is formed (after the formation of a photosensitive film). The degree of warping of a substrate after the film is formed is approximately the same as the degree of warping of the substrate shortly before the exposure treatment. Thus, the measured data transmitted to the exposure device are effective in reducing the impact on exposure treatment caused by warping of a substrate. In addition, measured warping data are obtained before the substrate is transferred to the exposure device. Thus, measured data are obtained after the film is formed on a substrate while the substrate waits for its turn to be transferred to the exposure device. Accordingly, the substrate processing method is effective in reducing the impact on exposure treatment caused by warping of a substrate while suppressing a decrease in throughput.

After measured warping data of a substrate are obtained, but before the substrate is transmitted to the exposure device, a roughening process on the substrate back surface may be conducted based on the measured warping data.

In such a case, transmitting the measured warping data to the exposure device is not always required. Namely, the substrate processing method may include: forming a photosensitive film on a front surface of a substrate; obtaining measured warping data of the substrate after the photosensitive film is formed; after the measured warping data are obtained, roughening the substrate back surface based on the measured warping data; and transferring the substrate to the exposure device after the substrate back surface is roughened.

When a warped substrate is positioned on a mounting plate of the exposure device, the substrate is forced flat during the adsorption process or the like. At that time, if the substrate back surface does not slide well on the mounting plate of the exposure device, the degree of distortion increases when the substrate is made flat, and accuracy may decrease during the exposure treatment. By contrast, by roughening the substrate back surface, Coulomb's force decreases between the mounting plate of the exposure device and the substrate back surface, and sliding between those surfaces is improved. As a result, a decrease in the exposure accuracy caused by distortion of the substrate is suppressed. In addition, by roughening a substrate based on the measured warping data, the roughening process is set at an appropriate degree, and a decrease in throughput is suppressed. Accordingly, the substrate processing apparatus is also effective in suppressing a decrease in throughput while reducing the impact on exposure treatment caused by warping of a substrate.

Based on the measured warping data, the back surface of a substrate is roughened when it is found to be in a concave shape, but it is an option not to perform a roughening process on the back surface in other conditions.

When no warping is found on the back surface, distortion of a substrate is unlikely to occur on the mounting plate of the exposure device. When the back surface of a substrate is in a convex shape, its central portion first touches the mounting plate of the exposure device. Thus, the periphery of the substrate is less likely to be constrained from moving when the wafer is adsorbed on the surface, and distortion tends not to occur in the substrate. When the back surface of a substrate is in a concave shape, the periphery touches first the mounting plate of the exposure device. Thus, the periphery of the substrate is more likely to be constrained from moving during the adsorption process, and distortion of the substrate tends to occur. Therefore, the back surface is roughened only when it is found to be in a concave shape so that a decrease in throughput is suppressed while the impact on exposure treatment is also reduced.

The substrate processing method may further include the following: based on the measured warping data of a substrate, setting a release region on the substrate; after the substrate is loaded into the exposure device and is adsorbed thereon, releasing the adsorption on the release region and on the region extending from the release region to the substrate periphery; adsorbing the release region again by expanding the adsorbed region of the substrate toward the periphery; and performing exposure treatment after the release region is adsorbed again. By so setting, the impact on exposure treatment caused by warping of a substrate is reduced.

The memory medium according to an embodiment of the present invention is a computer readable memory medium that stores a program for the apparatus to execute the above substrate processing methods.

The substrate processing apparatuses, substrate processing methods, and a memory medium according to the embodiment of the present invention are capable of suppressing a decrease in throughput while reducing the impact on exposure treatment caused by warping of a substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate processing system, comprising:
   a film-forming device configured to form a photosensitive film on a front surface of a substrate;
   an exposure device configured to expose the photosensitive film formed on the substrate;
   a relay device positioned between the film-forming device and the exposure device and configured to transfer the substrate between the film-forming device and the exposure device;
   a warping data acquisition device configured to measure a back surface of the substrate such that measured warping data of the substrate having the photosensitive film formed thereon are acquired;
   a communication device configured to perform data communication with the exposure device such that the measured warping data of the substrate are transmitted to the exposure device; and
   a control device comprising circuitry configured to control the film-forming device such that the film-forming device forms the photosensitive film on the front surface of the substrate, control the relay device such that the relay device transfers the substrate having the photosensitive film to the exposure device, control the warping data acquisition device such that the warping data acquisition device measures the back surface of the substrate and acquires the measured warping data after controlling the firm-forming device prior to controlling the relay device, determine whether roughening process is to be applied on the back surface of the substrate based on the measured warping data prior to transferring the substrate to the exposure device, and control the communication device such that the communication device transmits the measured warping data to the exposure device.

2. A substrate processing system according to claim 1, further comprising:
   a roughening process device configured to apply roughening process on the back surface of the substrate,
   wherein the circuitry of the control device is configured to control the roughening process device such that the roughening process device applies the roughening process on the back surface of the substrate based on the measured warping data after controlling the warping data acquisition device prior to the controlling the relay device.

3. A substrate processing system according to claim 1, wherein the warping data acquisition device includes a holding device configured to hold a periphery of the substrate and a measuring device configured to measure warping of the substrate held by the holding device.

4. A substrate processing system according to claim 3, wherein the measuring device is positioned on a back side of the substrate held by the holding device such that the measuring device is configured to measure a distance to the back surface of the substrate.

5. A substrate processing system according to claim 4, wherein the warping data acquisition device includes a back-surface inspection device configured to detect a contaminant attached to the back surface of the substrate.

6. A substrate processing system according to claim 5, wherein the measuring device comprises a laser displacement gauge configured to scan laser on the back surface of the substrate and measure the distance to the back surface of the substrate, and the back surface inspection device comprises an image inspection device configured to take an image and detect the contaminant from the image.

7. A substrate processing system according to claim 6, wherein the warping data acquisition device includes a transfer device configured to transfer the substrate such that the transfer device changes spots whose images are taken by the back surface inspection device, and the measuring device is configured to move laser irradiation spots in a direction which intersects with a direction in which the substrate is transferred by the transfer device and measure the distance to the irradiation spots.

8. A substrate processing system according to claim 5, wherein the circuitry of the control device is configured to control the warping data acquisition device such that the back-surface inspection device inspects the contaminant after controlling the film-forming device prior to controlling the measuring device.

9. A substrate processing system, comprising:
   a film-forming device configured to form a photosensitive film on a front surface of a substrate;
   an exposure device configured to expose the photosensitive film formed on the substrate;
   a relay device positioned between the film-forming device and the exposure device and configured to transfer the substrate between the film-forming device and the exposure device;
   a warping data acquisition device configured to measure a back surface of the substrate such that measured warping data of the substrate having the photosensitive film formed thereon are acquired;
   a roughening process device configured to apply roughening process on the back surface of the substrate; and
   a control device comprising circuitry configured to control the film-forming device such that the film-forming device forms the photosensitive film on the front surface of the substrate, control the relay device such that the relay device transfers the substrate having the photosensitive film to the exposure device, control the warping data acquisition device such that the warping data acquisition device measures the back surface of the substrate and acquires the measured warping data after controlling the film-forming device prior to controlling the relay device, determine whether roughening process is to be applied on the back surface of the substrate based on the measured warping data prior to transferring the substrate to the exposure device, and control the roughening process device such that the roughening process device applies the roughening process on the back surface of the substrate based on the measured warping data after controlling the warping data acquisition device prior to controlling the relay device.

10. A substrate processing system according to claim 9, wherein the warping data acquisition device includes a holding device configured to hold a periphery of the substrate and a measuring device configured to measure warping of the substrate held by the holding device.

11. A substrate processing system according to claim 10, wherein the measuring device is positioned on a back side of the substrate held by the holding device such that the measuring device is configured to measure a distance to the back surface of the substrate.

12. A substrate processing system according to claim 11, wherein the warping data acquisition device includes a back-surface inspection device configured to detect a contaminant attached to the back surface of the substrate.

13. A substrate processing system according to claim 12, wherein the measuring device comprises a laser displacement gauge configured to scan laser on the back surface of the substrate and measure the distance to the back surface of the substrate, and the back surface inspection device comprises an image inspection device configured to take an image and detect the contaminant from the image.

14. A substrate processing system according to claim 13, wherein the warping data acquisition device includes a transfer device configured to transfer the substrate such that the transfer device changes spots whose images are taken by the back surface inspection device, and the measuring device is configured to move laser irradiation spots in a direction which intersects with a direction in which the substrate is transferred by the transfer device and measure the distance to the irradiation spots.

15. A substrate processing system according to claim 12, wherein the circuitry of the control device is configured to control the warping data acquisition device such that the back-surface inspection device inspects the contaminant after controlling the film-forming device prior to controlling the measuring device.

16. A non-transitory computer readable medium including a program, which when executed by the control device of the substrate processing system according to claim 1, causes the circuitry of the control device to:
  control the film-forming device such that the film-forming device forms the photosensitive film on the front surface of the substrate;
  control the warping data acquisition device such that the warping data acquisition device acquires the measured warping data of the substrate having the photosensitive film;
  control the relay device such that the relay device transfers the substrate from the film-forming device to the exposure device after acquisition of the measured warping data; and
  control the communication device such that the communication device transmits the measured warping data to the exposure device.

17. A substrate processing system according to claim 2, wherein the warping data acquisition device includes a holding device configured to hold a periphery of the substrate and a measuring device configured to measure warping of the substrate held by the holding device.

18. A substrate processing system according to claim 17, wherein the measuring device is positioned on a back side of the substrate held by the holding device such that the measuring device is configured to measure a distance to the back surface of the substrate.

19. A substrate processing system according to claim 18, wherein the warping data acquisition device includes a back-surface inspection device configured to detect a contaminant attached to the back surface of the substrate.

20. A substrate processing system according to claim 19, wherein the measuring device comprises a laser displacement gauge configured to scan laser on the back surface of the substrate and measure the distance to the back surface of the substrate, and the back surface inspection device comprises an image inspection device configured to take an image and detect the contaminant from the image.

* * * * *